(12) United States Patent
Law et al.

(10) Patent No.: US 7,439,191 B2
(45) Date of Patent: Oct. 21, 2008

(54) DEPOSITION OF SILICON LAYERS FOR ACTIVE MATRIX LIQUID CRYSTAL DISPLAY (AMLCD) APPLICATIONS

(75) Inventors: Kam Law, Union City, CA (US); Quanyuan Shang, Saratoga, CA (US); William Reid Harshbarger, San Jose, CA (US); Dan Maydan, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 907 days.

(21) Appl. No.: 10/117,692

(22) Filed: Apr. 5, 2002

(65) Prior Publication Data

US 2003/0189208 A1 Oct. 9, 2003

(51) Int. Cl.
*H01L 21/31* (2006.01)
(52) U.S. Cl. .................. 438/758; 438/149; 438/485; 438/761; 257/E21.561
(58) Field of Classification Search .................. 438/485, 438/585, 763, 786, 128, 129, 149, 151, 158, 438/161, 164, 180, 197, 211, 311, 364, 478, 438/479, 758, 761; 257/E21.561
See application file for complete search history.

(56) References Cited

U.S. PATENT DOCUMENTS

| 4,058,430 A | 11/1977 | Suntola et al. ............... 156/611 |
| 4,389,973 A | 6/1983 | Suntola et al. ............... 118/725 |
| 4,413,022 A | 11/1983 | Suntola et al. ............ 427/255.2 |
| 4,486,487 A | 12/1984 | Skarp .......................... 428/216 |
| 4,767,494 A | 8/1988 | Kobayashi et al. ........... 156/606 |
| 4,806,321 A | 2/1989 | Nishizawa et al. ........... 422/245 |
| 4,813,846 A | 3/1989 | Helms ....................... 414/744.1 |
| 4,829,022 A | 5/1989 | Kobayashi et al. ........... 437/107 |
| 4,834,831 A | 5/1989 | Nishizawa et al. ........... 156/611 |
| 4,838,983 A | 6/1989 | Schumaker et al. .......... 156/613 |
| 4,838,993 A | 6/1989 | Aoki et al. ................... 156/643 |
| 4,840,921 A | 6/1989 | Matsumoto .................... 437/89 |
| 4,845,049 A | 7/1989 | Sunakawa ..................... 437/81 |
| 4,859,625 A | 8/1989 | Matsumoto .................... 437/81 |
| 4,859,627 A | 8/1989 | Sunakawa ..................... 437/81 |
| 4,861,417 A | 8/1989 | Mochizuki et al. ........... 156/610 |
| 4,876,218 A | 10/1989 | Pessa et al. .................. 437/107 |

(Continued)

FOREIGN PATENT DOCUMENTS

DE 196 27 017 A1 1/1997

(Continued)

OTHER PUBLICATIONS

International Application No. PCT/US 03/09941, Partial International Search Report dated Nov. 13, 2003.

(Continued)

*Primary Examiner*—Charles D. Garber
*Assistant Examiner*—Stanetta D Isaac
(74) *Attorney, Agent, or Firm*—Patterson & Sheridan LLP

(57) ABSTRACT

A method of silicon layer deposition using a cyclical deposition process. The cyclical deposition process comprises alternately adsorbing a silicon-containing precursor and a reducing gas on a substrate structure. Thin film transistors, such as for example a bottom-gate transistor or a top-gate transistor, including one or more silicon layers may, be formed using such cyclical deposition techniques.

72 Claims, 8 Drawing Sheets

U.S. PATENT DOCUMENTS

| | | | |
|---|---|---|---|
| 4,917,556 A | 4/1990 | Stark et al. ............... 414/217 |
| 4,927,670 A | 5/1990 | Erbil ..................... 427/255.3 |
| 4,931,132 A | 6/1990 | Aspnes et al. ............. 156/601 |
| 4,951,601 A | 8/1990 | Maydan et al. ............ 118/719 |
| 4,960,720 A | 10/1990 | Shimbo ................... 437/105 |
| 4,975,252 A | 12/1990 | Nishizawa et al. .......... 422/245 |
| 4,993,357 A * | 2/1991 | Scholz ................... 118/715 |
| 5,000,113 A | 3/1991 | Wang et al. ............... 118/723 |
| 5,013,683 A | 5/1991 | Petroff et al. .............. 437/110 |
| 5,028,565 A | 7/1991 | Chang et al. ............... 437/192 |
| 5,082,798 A | 1/1992 | Arimoto .................. 437/108 |
| 5,085,885 A | 2/1992 | Foley et al. ................. 477/38 |
| 5,091,320 A | 2/1992 | Aspnes et al. ............... 437/8 |
| 5,112,439 A | 5/1992 | Reisman et al. |
| 5,130,269 A | 7/1992 | Kitahara et al. ............. 437/111 |
| 5,166,092 A | 11/1992 | Mochizuki et al. .......... 437/105 |
| 5,173,474 A | 12/1992 | Connell et al. ................ 505/1 |
| 5,186,718 A | 2/1993 | Tepman et al. ............. 29/25.01 |
| 5,205,077 A | 4/1993 | Wittstock ................ 51/165 R |
| 5,225,366 A | 7/1993 | Yoder ..................... 437/108 |
| 5,234,561 A | 8/1993 | Randhawa et al. ..... 204/192.38 |
| 5,246,536 A | 9/1993 | Nishizawa et al. .......... 156/610 |
| 5,250,148 A | 10/1993 | Nishizawa et al. .......... 156/611 |
| 5,254,207 A | 10/1993 | Nishizawa et al. .......... 156/601 |
| 5,256,244 A | 10/1993 | Ackerman ................ 156/613 |
| 5,259,881 A | 11/1993 | Edwards et al. ............ 118/719 |
| 5,270,247 A | 12/1993 | Sakuma et al. ............. 437/133 |
| 5,273,930 A | 12/1993 | Steele et al. |
| 5,278,435 A | 1/1994 | Van Hove et al. .......... 257/184 |
| 5,281,274 A | 1/1994 | Yoder ..................... 118/697 |
| 5,286,296 A | 2/1994 | Sato et al. ................. 118/719 |
| 5,288,658 A * | 2/1994 | Ishihara .................... 438/485 |
| 5,290,748 A | 3/1994 | Knuuttila et al. ........... 502/228 |
| 5,294,286 A * | 3/1994 | Nishizawa et al. ............. 117/93 |
| 5,296,403 A | 3/1994 | Nishizawa et al. .......... 437/133 |
| 5,300,186 A | 4/1994 | Kitahara et al. ............. 156/613 |
| 5,311,055 A | 5/1994 | Goodman et al. ........... 257/593 |
| 5,316,615 A | 5/1994 | Copel et al. ................. 117/95 |
| 5,316,793 A | 5/1994 | Wallace et al. ........... 427/248.1 |
| 5,330,610 A | 7/1994 | Eres et al. .................. 117/86 |
| 5,332,689 A | 7/1994 | Sandhu et al. ............. 437/109 |
| 5,336,324 A | 8/1994 | Stall et al. ................. 118/719 |
| 5,338,389 A * | 8/1994 | Nishizawa et al. ............ 117/89 |
| 5,348,911 A | 9/1994 | Jurgensen et al. ............. 117/91 |
| 5,372,860 A | 12/1994 | Fehlner et al. |
| 5,374,570 A | 12/1994 | Nasu et al. .................. 437/40 |
| 5,395,791 A | 3/1995 | Cheng et al. ............... 437/105 |
| 5,438,952 A | 8/1995 | Otsuka ..................... 117/84 |
| 5,439,876 A | 8/1995 | Graf et al. .................. 505/447 |
| 5,441,703 A | 8/1995 | Jurgensen ................. 422/129 |
| 5,443,033 A | 8/1995 | Nishizawa et al. ............ 117/86 |
| 5,443,647 A | 8/1995 | Aucoin et al. ......... 118/723 ME |
| 5,455,072 A | 10/1995 | Bension et al. ........... 427/255.7 |
| 5,458,084 A | 10/1995 | Thorne et al. ................ 117/89 |
| 5,469,806 A | 11/1995 | Mochizuki et al. ........... 117/97 |
| 5,480,818 A | 1/1996 | Matsumoto et al. ........... 437/40 |
| 5,483,919 A | 1/1996 | Yokoyama et al. ........... 117/89 |
| 5,484,664 A | 1/1996 | Kitahara et al. ............. 428/641 |
| 5,503,875 A | 4/1996 | Imai et al. ................. 427/255.3 |
| 5,521,126 A | 5/1996 | Okamura et al. ........... 437/235 |
| 5,527,733 A | 6/1996 | Nishizawa et al. .......... 437/160 |
| 5,532,511 A | 7/1996 | Nishizawa et al. .......... 257/627 |
| 5,540,783 A | 7/1996 | Eres et al. ................. 118/725 |
| 5,580,380 A | 12/1996 | Liu et al. .................... 117/86 |
| 5,601,651 A | 2/1997 | Watabe .................... 118/715 |
| 5,609,689 A | 3/1997 | Kato et al. ................. 118/719 |
| 5,616,181 A | 4/1997 | Yamamoto et al. .... 118/723 ER |
| 5,637,530 A | 6/1997 | Gaines et al. ............... 114/105 |
| 5,641,984 A | 6/1997 | Aftergut et al. ............ 257/433 |
| 5,644,128 A | 7/1997 | Wollnik et al. ............. 250/251 |
| 5,667,592 A | 9/1997 | Boitnott et al. ............. 118/719 |
| 5,674,304 A | 10/1997 | Fukada et al. |
| 5,674,786 A | 10/1997 | Turner et al. ............... 437/225 |
| 5,693,139 A | 12/1997 | Nishizawa et al. ............ 117/89 |
| 5,695,564 A | 12/1997 | Imahashi .................. 118/719 |
| 5,705,224 A | 1/1998 | Murota et al. ............ 427/248.1 |
| 5,707,880 A | 1/1998 | Aftergut et al. ................. 437/3 |
| 5,711,811 A | 1/1998 | Suntola et al. .............. 118/711 |
| 5,730,801 A | 3/1998 | Tepman et al. ............. 118/719 |
| 5,730,802 A | 3/1998 | Ishizumi et al. ............. 118/719 |
| 5,747,113 A | 5/1998 | Tsai ..................... 427/255.5 |
| 5,749,974 A | 5/1998 | Habuka et al. .............. 118/725 |
| 5,788,447 A | 8/1998 | Yonemitsu et al. .......... 414/217 |
| 5,788,799 A | 8/1998 | Steger et al. ............... 156/345 |
| 5,796,116 A * | 8/1998 | Nakata et al. ................. 257/66 |
| 5,801,634 A | 9/1998 | Young et al. ............... 340/635 |
| 5,807,792 A | 9/1998 | Ilg et al. .................... 438/758 |
| 5,830,270 A | 11/1998 | McKee et al. .............. 117/106 |
| 5,835,677 A | 11/1998 | Li et al. .................... 392/401 |
| 5,851,849 A | 12/1998 | Comizzoli et al. ............ 438/38 |
| 5,855,675 A | 1/1999 | Doering et al. ............. 118/719 |
| 5,855,680 A | 1/1999 | Soininen et al. ............ 118/719 |
| 5,856,219 A | 1/1999 | Naito et al. ................ 438/241 |
| 5,858,102 A | 1/1999 | Tsai ........................ 118/719 |
| 5,866,213 A | 2/1999 | Foster et al. ................ 427/573 |
| 5,866,795 A | 2/1999 | Wang et al. ................ 73/1.36 |
| 5,879,459 A | 3/1999 | Gadgil et al. ............... 118/715 |
| 5,882,165 A | 3/1999 | Maydan et al. ............. 414/217 |
| 5,882,413 A | 3/1999 | Beaulieu et al. ............ 118/719 |
| 5,904,565 A | 5/1999 | Nguyen et al. ............. 438/687 |
| 5,906,680 A | 5/1999 | Meyerson |
| 5,916,365 A | 6/1999 | Sherman ..................... 117/92 |
| 5,923,056 A | 7/1999 | Lee et al. .................. 257/192 |
| 5,923,985 A | 7/1999 | Aoki et al. ................. 438/301 |
| 5,925,574 A | 7/1999 | Aoki et al. .................. 437/31 |
| 5,928,389 A | 7/1999 | Jevtic ..................... 29/25.01 |
| 5,942,040 A | 8/1999 | Kim et al. ................. 118/726 |
| 5,947,710 A | 9/1999 | Cooper et al. ................ 418/63 |
| 5,972,430 A | 10/1999 | DiMeo, Jr. et al. ...... 427/255.32 |
| 6,001,669 A | 12/1999 | Gaines et al. ............... 438/102 |
| 6,015,590 A | 1/2000 | Suntola et al. .......... 427/255.23 |
| 6,025,627 A | 2/2000 | Forbes et al. ............... 257/321 |
| 6,036,773 A | 3/2000 | Wang et al. .................. 117/97 |
| 6,042,652 A | 3/2000 | Hyun et al. ................. 118/719 |
| 6,042,654 A | 3/2000 | Comita et al. |
| 6,043,177 A | 3/2000 | Falconer et al. ................ 502/4 |
| 6,051,286 A | 4/2000 | Zhao et al. ................. 427/576 |
| 6,062,798 A | 5/2000 | Muka ....................... 414/416 |
| 6,071,808 A | 6/2000 | Merchant et al. ........... 438/633 |
| 6,084,302 A | 7/2000 | Sandhu .................... 257/751 |
| 6,086,677 A | 7/2000 | Umotoy et al. ............. 118/715 |
| 6,110,556 A | 8/2000 | Bang et al. ............... 428/64.1 |
| 6,113,977 A | 9/2000 | Soininen et al. .............. 427/64 |
| 6,117,244 A | 9/2000 | Bang et al. ................. 118/715 |
| 6,124,158 A | 9/2000 | Dautartas et al. ........... 438/216 |
| 6,130,147 A | 10/2000 | Major et al. ................ 438/604 |
| 6,139,700 A | 10/2000 | Kang et al. ............. 204/192.17 |
| 6,140,237 A | 10/2000 | Chan et al. ................ 438/687 |
| 6,140,238 A | 10/2000 | Kitch ....................... 438/687 |
| 6,143,659 A | 11/2000 | Leem ...................... 438/688 |
| 6,144,060 A | 11/2000 | Park et al. ................. 257/310 |
| 6,158,446 A | 12/2000 | Mohindra et al. ........... 134/25.4 |
| 6,159,852 A | 12/2000 | Nuttall et al. |
| 6,162,716 A * | 12/2000 | Yu et al. ................... 438/592 |
| 6,174,377 B1 | 1/2001 | Doering et al. ............. 118/729 |
| 6,174,809 B1 | 1/2001 | Kang et al. ................ 438/682 |
| 6,200,893 B1 | 3/2001 | Sneh ....................... 438/685 |
| 6,203,613 B1 | 3/2001 | Gates et al. ................ 117/104 |
| 6,206,967 B1 * | 3/2001 | Mak et al. ................. 118/666 |
| 6,207,302 B1 | 3/2001 | Sugiura et al. .............. 428/690 |
| 6,232,196 B1 | 5/2001 | Raaijmakers et al. |
| 6,248,605 B1 | 6/2001 | Harkonen et al. ............. 438/29 |
| 6,270,572 B1 | 8/2001 | Kim et al. ................... 117/93 |
| 6,271,148 B1 | 8/2001 | Kao et al. .................. 438/727 |

| | | |
|---|---|---|
| 6,284,686 B1 | 9/2001 | Marlor |
| 6,287,965 B1 | 9/2001 | Kang et al. ................ 438/648 |
| 6,291,319 B1 | 9/2001 | Yu et al. |
| 6,291,876 B1 | 9/2001 | Stumborg et al. ........... 257/632 |
| 6,305,314 B1 | 10/2001 | Sneh et al. ............. 118/723 R |
| 6,306,216 B1 | 10/2001 | Kim et al. .................. 118/725 |
| 6,316,098 B1 | 11/2001 | Yitzchaik et al. ........... 428/339 |
| 6,338,990 B1 | 1/2002 | Yanai et al. ................ 438/160 |
| 6,342,277 B1 * | 1/2002 | Sherman .................... 427/562 |
| 6,348,420 B1 | 2/2002 | Raaijmakers et al. |
| 6,352,945 B1 | 3/2002 | Matsuki et al. |
| 6,358,829 B2 | 3/2002 | Yoon et al. |
| 6,383,955 B1 | 5/2002 | Matsuki et al. |
| 6,391,803 B1 | 5/2002 | Kim et al. |
| 6,410,463 B1 | 6/2002 | Matsuki |
| 6,416,822 B1 * | 7/2002 | Chiang et al. .............. 427/561 |
| 6,451,119 B2 | 9/2002 | Sneh et al. |
| 6,458,416 B1 * | 10/2002 | Derderian et al. .......... 427/301 |
| 6,458,718 B1 | 10/2002 | Todd |
| 6,462,367 B2 | 10/2002 | Marsh et al. |
| 6,468,924 B2 * | 10/2002 | Lee et al. ................... 438/763 |
| 6,489,241 B1 | 12/2002 | Thilderkvist et al. |
| 6,492,283 B2 | 12/2002 | Raaijmakers et al. |
| 6,534,395 B2 * | 3/2003 | Werkhoven et al. ......... 438/627 |
| 6,544,900 B2 | 4/2003 | Raaijmakers et al. |
| 6,559,520 B2 | 5/2003 | Matsuki et al. |
| 6,562,720 B2 | 5/2003 | Thilderkvist et al. |
| 6,627,260 B2 * | 9/2003 | Derderian et al. .......... 427/301 |
| 6,632,279 B1 | 10/2003 | Ritala et al. |
| 6,702,027 B2 * | 3/2004 | Olson et al. ................ 166/369 |
| 6,780,704 B1 * | 8/2004 | Raaijmakers et al. ....... 438/239 |
| 6,797,558 B2 | 9/2004 | Nuttall et al. |
| 6,821,563 B2 * | 11/2004 | Yudovsky ................ 427/248.1 |
| 6,821,825 B2 * | 11/2004 | Todd et al. ................. 438/150 |
| 6,825,134 B2 * | 11/2004 | Law et al. ................... 438/788 |
| 6,838,114 B2 * | 1/2005 | Carpenter et al. .............. 427/8 |
| 6,846,516 B2 * | 1/2005 | Yang et al. .............. 427/255.32 |
| 6,869,838 B2 * | 3/2005 | Law et al. ................... 438/207 |
| 6,958,253 B2 * | 10/2005 | Todd ........................... 438/47 |
| 2001/0000866 A1 | 5/2001 | Sneh et al. .............. 118/723 R |
| 2001/0009140 A1 | 7/2001 | Bondestam et al. ......... 118/725 |
| 2001/0011526 A1 | 8/2001 | Doering et al. ............. 118/729 |
| 2001/0020712 A1 | 9/2001 | Raaijmakers et al. |
| 2001/0024387 A1 | 9/2001 | Raaijmaker et al. |
| 2001/0024871 A1 | 9/2001 | Yagi |
| 2001/0028924 A1 | 10/2001 | Sherman |
| 2001/0031562 A1 | 10/2001 | Raaijmakers et al. ........ 438/770 |
| 2001/0034123 A1 | 10/2001 | Jeon et al. .................. 438/643 |
| 2001/0041250 A1 | 11/2001 | Werkhoven et al. ......... 428/212 |
| 2001/0042799 A1 | 11/2001 | Kim et al. .................. 239/553 |
| 2001/0046567 A1 | 11/2001 | Matsuki et al. |
| 2001/0050039 A1 * | 12/2001 | Park .......................... 117/102 |
| 2001/0055672 A1 | 12/2001 | Todd |
| 2002/0031618 A1 | 3/2002 | Sherman |
| 2002/0047151 A1 | 4/2002 | Kim et al. |
| 2002/0066411 A1 * | 6/2002 | Chiang et al. .............. 118/724 |
| 2002/0074588 A1 | 6/2002 | Lee |
| 2002/0076837 A1 | 6/2002 | Hujanen et al. |
| 2002/0081844 A1 * | 6/2002 | Jeon et al. .................. 438/680 |
| 2002/0090818 A1 | 7/2002 | Thilderkvist et al. |
| 2002/0093042 A1 | 7/2002 | Oh et al. |
| 2002/0098627 A1 | 7/2002 | Pomarede et al. |
| 2002/0145168 A1 | 10/2002 | Bojarczuk et al. |
| 2002/0168868 A1 | 11/2002 | Todd |
| 2002/0172768 A1 | 11/2002 | Endo et al. |
| 2002/0173113 A1 | 11/2002 | Todd |
| 2002/0173130 A1 | 11/2002 | Pomarede et al. |
| 2002/0197831 A1 | 12/2002 | Todd et al. |
| 2002/0197881 A1 | 12/2002 | Ramdani et al. |
| 2003/0003635 A1 * | 1/2003 | Paranjpe et al. ............. 438/149 |
| 2003/0013320 A1 * | 1/2003 | Kim et al. .................. 438/778 |
| 2003/0015764 A1 | 1/2003 | Raaijmaker et al. |
| 2003/0022528 A1 | 1/2003 | Todd |
| 2003/0032281 A1 | 2/2003 | Werkhoven et al. |
| 2003/0036268 A1 | 2/2003 | Brabant et al. |
| 2003/0060057 A1 | 3/2003 | Raaijmaker et al. |
| 2003/0070617 A1 * | 4/2003 | Kim et al. .................... 118/715 |
| 2003/0072975 A1 | 4/2003 | Shero et al. |
| 2003/0082300 A1 | 5/2003 | Todd et al. |
| 2003/0089942 A1 | 5/2003 | Haukka et al. |
| 2003/0116804 A1 | 6/2003 | Visokay et al. |
| 2003/0129826 A1 | 7/2003 | Werkhoven et al. |
| 2003/0160277 A1 | 8/2003 | Bhattacharyya |
| 2003/0173586 A1 | 9/2003 | Moriwaki et al. |
| 2003/0185980 A1 | 10/2003 | Endo |
| 2003/0186561 A1 | 10/2003 | Law et al. |
| 2003/0188682 A1 | 10/2003 | Tois et al. |
| 2003/0194853 A1 | 10/2003 | Jeon |
| 2004/0007747 A1 | 1/2004 | Visokay et al. |
| 2004/0009307 A1 | 1/2004 | Koh et al. |
| 2004/0009675 A1 | 1/2004 | Eissa et al. |
| 2004/0016973 A1 | 1/2004 | Rotondaro et al. |
| 2004/0023462 A1 | 2/2004 | Rotondaro et al. |
| 2004/0033698 A1 | 2/2004 | Lee et al. |
| 2004/0043149 A1 | 3/2004 | Gordon et al. |
| 2004/0043569 A1 | 3/2004 | Ahn et al. |
| 2004/0053484 A1 | 3/2004 | Kumar et al. |
| 2004/0129212 A1 * | 7/2004 | Gadgil et al. ................ 118/715 |
| 2004/0202786 A1 * | 10/2004 | Wongsenakhum et al. .. 427/250 |
| 2004/0213908 A1 * | 10/2004 | Derderian et al. ....... 427/255.28 |
| 2004/0224089 A1 * | 11/2004 | Singh et al. ............. 427/255.27 |
| 2004/0226911 A1 | 11/2004 | Dutton et al. |
| 2004/0247788 A1 * | 12/2004 | Fang et al. .................. 427/250 |
| 2004/0253776 A1 | 12/2004 | Hoffmann et al. |
| 2005/0023625 A1 * | 2/2005 | Ahn et al. ................... 257/410 |
| 2005/0079691 A1 | 4/2005 | Kim et al. |
| 2005/0208740 A1 * | 9/2005 | Todd .......................... 438/482 |

FOREIGN PATENT DOCUMENTS

| | | |
|---|---|---|
| DE | 198 20 147 A1 | 7/1999 |
| EP | 0 344 352 A1 | 6/1988 |
| EP | 0 442 290 A1 | 2/1991 |
| EP | 0 429 270 A2 | 5/1991 |
| EP | 0 799 641 A2 | 10/1997 |
| EP | 1 150 345 | 4/2001 |
| FR | 2.626.110 | 7/1989 |
| FR | 2.692.597 | 12/1993 |
| GB | 2 355 727 A | 5/2001 |
| JP | 58-098917 | 6/1983 |
| JP | 58-100419 | 6/1983 |
| JP | 60-065712 A | 4/1985 |
| JP | 61-035847 | 2/1986 |
| JP | 61-210623 | 9/1986 |
| JP | 61 229319 A | 10/1986 |
| JP | 62-069508 | 3/1987 |
| JP | 62-091495 | 4/1987 |
| JP | 62-141717 | 6/1987 |
| JP | 62-167297 | 7/1987 |
| JP | 62-171999 | 7/1987 |
| JP | 62-232919 | 10/1987 |
| JP | 63-062313 | 3/1988 |
| JP | 63-085098 | 4/1988 |
| JP | 63-090833 | 4/1988 |
| JP | 63-222420 | 9/1988 |
| JP | 63-222421 | 9/1988 |
| JP | 63-227007 | 9/1988 |
| JP | 63-252420 | 10/1988 |
| JP | 63-266814 | 11/1988 |
| JP | 64-009895 | 1/1989 |
| JP | 64-009896 | 1/1989 |
| JP | 64-009897 | 1/1989 |
| JP | 64-037832 | 2/1989 |
| JP | 64-082615 | 3/1989 |
| JP | 64-082617 | 3/1989 |
| JP | 64-082671 | 3/1989 |

| | | | | | |
|---|---|---|---|---|---|
| JP | 64-082676 | 3/1989 | JP | 05-160152 | 6/1993 |
| JP | 01-103982 | 4/1989 | JP | 05-175143 | 7/1993 |
| JP | 01-103996 | 4/1989 | JP | 05-175145 | 7/1993 |
| JP | 64-090524 | 4/1989 | JP | 05-182906 | 7/1993 |
| JP | 01-117017 | 5/1989 | JP | 05-186295 | 7/1993 |
| JP | 01-143221 | 6/1989 | JP | 05-206036 | 8/1993 |
| JP | 01-143233 | 6/1989 | JP | 05-234899 | 9/1993 |
| JP | 01-154511 | 6/1989 | JP | 05-235047 | 9/1993 |
| JP | 01-236657 | 9/1989 | JP | 05-251339 | 9/1993 |
| JP | 01-245512 | 9/1989 | JP | 05-270997 | 10/1993 |
| JP | 01-264218 | 10/1989 | JP | 05-283336 | 10/1993 |
| JP | 01-270593 | 10/1989 | JP | 05-291152 | 11/1993 |
| JP | 01-272108 | 10/1989 | JP | 05-304334 | 11/1993 |
| JP | 01-290221 | 11/1989 | JP | 05-343327 | 12/1993 |
| JP | 01-290222 | 11/1989 | JP | 05-343685 | 12/1993 |
| JP | 01-296673 | 11/1989 | JP | 06-045606 | 2/1994 |
| JP | 01-303770 | 12/1989 | JP | 06-132236 | 5/1994 |
| JP | 01-305894 | 12/1989 | JP | 06-177381 | 6/1994 |
| JP | 01-313927 | 12/1989 | JP | 06-196809 | 7/1994 |
| JP | 02-012814 | 1/1990 | JP | 06-222388 | 8/1994 |
| JP | 02-014513 | 1/1990 | JP | 06-224138 | 8/1994 |
| JP | 02-017634 | 1/1990 | JP | 06-230421 | 8/1994 |
| JP | 02-063115 | 3/1990 | JP | 06-252057 | 9/1994 |
| JP | 02-074029 | 3/1990 | JP | 06-291048 | 10/1994 |
| JP | 02-074587 | 3/1990 | JP | 07-070752 | 3/1995 |
| JP | 02-106822 | 4/1990 | JP | 07-086269 | 3/1995 |
| JP | 02-129913 | 5/1990 | JP | 08-181076 | 7/1996 |
| JP | 02-162717 | 6/1990 | JP | 08-245291 | 9/1996 |
| JP | 02-172895 | 7/1990 | JP | 08-264530 | 10/1996 |
| JP | 02-196092 | 8/1990 | JP | 09-260786 | 10/1997 |
| JP | 02-203517 | 8/1990 | JP | 09-293681 | 11/1997 |
| JP | 02-230690 | 9/1990 | JP | 10-188840 | 7/1998 |
| JP | 02-230722 | 9/1990 | JP | 10-190128 | 7/1998 |
| JP | 02-246161 | 10/1990 | JP | 10-308283 | 11/1998 |
| JP | 02-264491 | 10/1990 | JP | 11-269652 | 10/1999 |
| JP | 02-283084 | 11/1990 | JP | 2000-031387 | 1/2000 |
| JP | 02-304916 | 12/1990 | JP | 2000-058777 | 2/2000 |
| JP | 03-019211 | 1/1991 | JP | 2000-068072 | 3/2000 |
| JP | 03-022569 | 1/1991 | JP | 2000-087029 | 3/2000 |
| JP | 03-023294 | 1/1991 | JP | 2000-319772 | 3/2000 |
| JP | 03-023299 | 1/1991 | JP | 2000-138094 | 5/2000 |
| JP | 03-044967 | 2/1991 | JP | 2000-218445 | 8/2000 |
| JP | 03-048421 | 3/1991 | JP | 2000-319772 | 11/2000 |
| JP | 03-070124 | 3/1991 | JP | 2000-340883 | 12/2000 |
| JP | 03-185716 | 8/1991 | JP | 2000-353666 | 12/2000 |
| JP | 03-208885 | 9/1991 | JP | 2001-020075 | 1/2001 |
| JP | 03-234025 | 10/1991 | JP | 2001-62244 | 3/2001 |
| JP | 03-286522 | 12/1991 | JP | 2001-111000 | 4/2001 |
| JP | 03-286531 | 12/1991 | JP | 2001-152339 | 6/2001 |
| JP | 04-031391 | 2/1992 | JP | 2001-172767 | 6/2001 |
| JP | 04-031396 | 2/1992 | JP | 2001-189312 | 7/2001 |
| JP | 04-100292 | 4/1992 | JP | 2001-217206 | 8/2001 |
| JP | 04-111418 | 4/1992 | JP | 2001-220287 | 8/2001 |
| JP | 04-132214 | 5/1992 | JP | 2001-220294 | 8/2001 |
| JP | 04-132681 | 5/1992 | JP | 2001-240972 | 9/2001 |
| JP | 04/151822 | 5/1992 | JP | 2001-254181 | 9/2001 |
| JP | 04-162418 | 6/1992 | JP | 2001-284042 | 10/2001 |
| JP | 04-175299 | 6/1992 | JP | 2001-303251 | 10/2001 |
| JP | 04-186824 | 7/1992 | JP | 2001-328900 | 11/2001 |
| JP | 04-212411 | 8/1992 | WO | 90/02216 | 3/1990 |
| JP | 04-260696 | 9/1992 | WO | 91/10510 | 7/1991 |
| JP | 04-273120 | 9/1992 | WO | 93/02111 | 2/1993 |
| JP | 04-285167 | 10/1992 | WO | 96/17107 | 6/1996 |
| JP | 04-291916 | 10/1992 | WO | 96/18756 | 6/1996 |
| JP | 04-325500 | 11/1992 | WO | 98/06889 | 2/1998 |
| JP | 04-328874 | 11/1992 | WO | WO 98/20524 | 5/1998 |
| JP | 05-029228 | 2/1993 | WO | 98/51838 | 11/1998 |
| JP | 05-047665 | 2/1993 | WO | 99/13504 | 3/1999 |
| JP | 05-047666 | 2/1993 | WO | 99/29924 | 6/1999 |
| JP | 05-047668 | 2/1993 | WO | 99/41423 | 8/1999 |
| JP | 05-074717 | 3/1993 | WO | 00/11721 | 3/2000 |
| JP | 05-074724 | 3/1993 | WO | 00/15865 | 3/2000 |
| JP | 05-102189 | 4/1993 | WO | 00/15881 A2 | 3/2000 |

| | | |
|---|---|---|
| WO | 00/16377 A2 | 3/2000 |
| WO | 00/54320 A1 | 9/2000 |
| WO | WO 00/54320 | 9/2000 |
| WO | 00/63957 A1 | 10/2000 |
| WO | 00/79019 A1 | 12/2000 |
| WO | 00/79576 A1 | 12/2000 |
| WO | 01/15220 | 3/2001 |
| WO | 01/15220 A1 | 3/2001 |
| WO | 01/27346 A1 | 4/2001 |
| WO | 01/27347 A1 | 4/2001 |
| WO | 01/29280 A1 | 4/2001 |
| WO | 01/29891 A1 | 4/2001 |
| WO | 01/29893 A1 | 4/2001 |
| WO | 01/36702 A1 | 5/2001 |
| WO | 01/40541 A1 | 6/2001 |
| WO | WO 01/41544 | 6/2001 |
| WO | 01/66832 A2 | 9/2001 |
| WO | WO 02/43115 | 5/2002 |
| WO | WO 02/45167 | 6/2002 |
| WO | WO 02/064853 | 8/2002 |
| WO | WO 02/065508 | 8/2002 |
| WO | WO 02/065516 | 8/2002 |
| WO | WO 02/065517 | 8/2002 |
| WO | WO 02/065525 | 8/2002 |
| WO | WO 02/080244 | 10/2002 |
| WO | WO 02/097864 | 12/2002 |

OTHER PUBLICATIONS

Srinivasan, E., et al., "Hydrogen elimination and phase transitions in pulsed-gas plasma deposition of amorphous and microcrystalline silicon", J. Appl. Phys., vol. 81, No. 6, dated Mar. 15, 1997, pp. 2847-2855.

Srinavasan, E., et al., "Dominant monohydride bonding in hydrogenated amorphous silicon thin films formed by plasma enhanced chemical vapor deposition at room temperature", J. Vac. Sci. Technol. A, vol. 15, No. 1, dated Jan./Feb. 1997, pp. 77-84.

Srinavasan, E., et al., "Large Crystallite Polysilicon Deposited Using Pulsed-Gas PECVD At Temperatures Less Than 250° C.", Mat. Res. Soc. Symp. Proc. vol. 452, Dec. 2-6, 1996, pp. 989-994.

Yokoyama, S., et al., "Self-limiting atomic-layer deposition of Si on $SiO_2$ by alternate supply of $Si_2H_6$ and $SiCl_4$", 2001 American Institute of Physics, vol. 79, No. 5, dated Jul. 30, 2001, pp. 617-619.

Hultman, et al., "Review of the thermal and mechanical stability of TiN-based thin films", Zeitschrift Fur Metallkunde, 90(10) (Oct. 1999), pp. 803-813.

Klaus, et al., "Atomic Layer Deposition of $SiO_2$ Using Catalyzed and Uncatalyzed Self-Limiting Surface Reactions", Surface Review & Letters, 6(3&4) (1999), pp. 435-448.

Yamaguchi, et al., "Atomic-layer chemical-vapor-deposition of silicon dioxide films with extremely low hydrogen content", Appl. Surf. Sci., vol. 130-132 (1998), pp. 202-207.

George, et al., "Surface Chemistry for Atomic Layer Growth", J. Phys. Chem., vol. 100 (1996), pp. 13121-13131.

George, et al., "Atomic layer controlled deposition of $SiO_2$ and $Al_2O_3$ using ABAB . . . binary reaction sequence chemistry", Appl. Surf. Sci., vol. 82/83 (1994), pp. 460-467.

Wise, et al., "Diethyldiethoxysilane as a new precursor for $SiO_2$ growth on silicon", Mat. Res. Soc. Symp. Proc., vol. 334 (1994), pp. 37-43.

Niinisto, et al., "Synthesis of oxide thin films and overlayers by atomic layer epitaxy for advanced applications", Mat. Sci. & Eng., vol. B41 (1996), pp. 23-29.

Ritala, et al.,"Perfectly conformal TiN and $Al_2O_3$ films deposited by atomic layer deposition", Chemical Vapor Deposition, vol. 5(1) (Jan. 1999), pp. 7-9.

Klaus, et al., "Atomically controlled growth of tungsten and tungsten nitride using sequential surface reactions", Appl. Surf. Sci., vol. 162-163 (Jul. 1999), pp. 479-491.

Klaus, et al., "Atomically controlled growth of tungsten and tungsten nitride using sequential surface reactions", Fifth Int'l Symp. On Atomically Controlled Surfaces. Interfaces and Nanostructures (Jul. 6-9, 1999), Aix en Provence. France.

Min, et al., "Atomic layer deposition of TiN thin films by sequential introduction of Ti precursor and NH/sub3/", Symp.: Advanced Interconnects and Contact Materials and Processes for Future Integrated Circuits (Apr. 13-16, 1998), pp. 337-342.

Min, et al., "Metal-Organic Atomic-Layer Depostion of Titanium-Silicon-Nitride Films", Applied Physics Letters, American Inst. Of Physics, vol. 75(11) (Sep. 13, 1999).

Maertensson, et al., "Atomic Layer Epitaxy of Copper on Tantalum", Chemical Vapor Deposition, 3(1) (Feb. 1, 1997), pp. 45-50.

Ritala, et al., "Atomic Layer Epitaxy Growth of TiN Thin Films", J. Electrochem. Soc., 142(8) (Aug. 1995), pp. 2731-2737.

Elers, et al., "NbCl5 as a precursor in atomic layer epitaxy", Appl. Surf. Sci., vol. 82/83 (1994), pp. 468-474.

Lee, "The Preparation of Titanium-Based Thin Film by CVD Using Titanium Chlorides as precursors", Chemical Vapor Deposition, 5(2) (Mar. 1999), pp. 69-73.

Martensson, et al., "Atomic Layer Epitaxy of Copper, Growth & Selectivity in the Cu (II)-2,2.6,6-Tetramethyl-3, 5-Heptanedion ATE/ H2 Process", J. Electrochem. Soc., 145(8) (Aug. 1998), pp. 2926-2931.

Min, et al., "Chemical Vapor Deposition of Ti-Si-N Films with Alternating Source Supply", Mat., Res. Soc. Symp. Proc., vol. 564 (Apr. 5, 1999), pp. 207-210.

Bedair, "Atomic layer epitaxy deposition processes", J. Vac. Sci. Technol. 12(1) (Jan./Feb. 1994).

Yamaga, et al., "Atomic layer epitaxy of ZnS by a new gas supplying system in a low-pressure metalorganic vapor phase epitaxy", J. of Crystal Growth 117 (1992), pp. 152-155.

Ohba, et al., "Thermal Decomposition of Methylhydrazine and Deposition Properties of CVD TiN Thin Films", Conference Proceedings, Advanced Metallization for ULSI Applications in 1993 (1994), pp. 143-149.

Scheper, et al.,"Low-temperature deposition of titanium nitride films from dialkylhydrazine-based precursors" , Materials Science in Semiconductor Processing 2 (1999), pp. 149-157.

Suzuki, et al., "A 0.2-μm contact filing by 450° C.-hydrazine-reduced TiN film with low resistivity", IEDM 92-979, pp. 11.8.1-11.8.3.

Suzuki, et al., "LPCVD-TiN Using Hydrazine and $TiCl_4$", VMIC Conference (Jun. 8-9, 1993), pp. 418-423.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools" (May 1992), pp. 190-191.

McGeachin, S., "Synthesis and properties of some β-diketimines derived from acetylacetone, and their metal complexes", Canadian J. of Chemistry, vol. 46 (1968), pp. 1903-1912.

Solanki, et al., "Atomic Layer deposition of Copper Seed Layers", Electrochemical and Solid State Letters, 3(10) (2000), pp. 479-480.

Nerac.com Retro Search: Atomic Layer Deposition of Copper, dated Oct. 11, 2001.

Nerac.com Retro Search: Atomic Layer Decomposition / Epitaxy Aluminum Oxide Plasma, dated Oct. 2, 2001.

Nerac Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

Nerac Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149-154.

Choi, et al., "The effect of annealing on resistivity of low pressure chemical vapor depositied titanium diboride", J. Appl. Phys. 69(11) (Jun. 1, 1991), pp. 7853-7861.

Choi, et al. "Stability of $TiB_2$ as a Diffusion Barrier on Silicon", J. Electrochem. Soc. 138(10) (Oct. 1991), pp. 3062-3067.

"Cluster Tools for Fabrication of Advanced devices" Jap. J. of Applied Physics, Extended Abstracts, 22$^{nd}$ Conference Solid State Devices and Materials (1990), pp. 849-852 XP000178141.

"Applications of Integrated processing", Solid State Technology, US, Cowan Pub., vol. 37, No. 12 (Dec. 1, 1994), pp. 45-47.

Kitigawa, et al., "Hydrogen-mediated low temperature epitaxy of Si in plasma-enhanced chemical vapor deposition", Applied Surface Science (2000), pp. 30-34.

Lee, et al., "Pulsed nucleation for ultra-high aspect ratio tungsten plugfill", Novellus Systems, Inc. (2001), pp. 1-2 (*Copy Not Available to Applicant at this Time*).

Argarwal, et al. "Challenges in Integrating the High-K Gate Dielectric Film to the Conventional CMOS Process Flow," Mat. Sec. Soc. Sump. Proc. vol. 670 (2001) pp. K2.1.1-K2.1.11.

Bedair, "Atomic Layer Epitaxy Deposition Processes," J. Vac. Sci. Technol. B., vol. 12, No. 1, Jan./Feb. 1994.

Derbyshire, "Applications of Integrated Processing," Solid State Technology, Dec. 1994 pp. 45-48.

Hwang, et al. "Nanometer-Size α-PbO$_2$-Type TiO$_2$ in Garnet: A Thermobarometer for Ultrahigh-Pressure Metamorphism," Science Vo. 288 (Apr. 14, 2000) pp. 321-324.

Lee, et al. "Cyclic Technique for the Enhancement of Highly Oriented Diamond Film Growth," Thin Solid Films 303 (1997) pp. 264-269.

Ritala, et al. "Atomic Layer Deposition of Oxide Thin Films with Metal Alkoxides as Oxygen Sources," Science vol. 288 Apr. 14, 2000 pp. 319-321.

Jeong, et al. "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001 pp. 285-289.

Jeong, et al. "Growth and Characterization of Aluminum Oxide (Al$_2$O$_3$) Thin Films by Plasma-Assisted Atomic Layer Controlled Deposition," J. Korean Inst. Met. Mater., vol. 38, No. 10, Oct. 2000 pp. 1395-1399.

Kamins, et al. "Kinetics of selective epitaxial deposition of Si$_{1-x}$Ge$_x$", Applied Physics Letters, American Institute pf Physics. New York, US, vol. 61, No. 6, Aug. 10, 1992, pp. 669-671.

Menon, et al. "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.

Paranjpe, et al. "Atomic Layer Deposition of AlO$_x$ for Thin Film Head Gap Applications," J. Electrochem. Soc., vol. 148, No. 9, Sep. 2001 pp. G465-G471.

Sedgwick, et al. "Selective SiGe and heavily As doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.

Uchino, et al. "A Raised Source/Drain Technology Using In-situ P-doped SiGe and B-doped Si for 0.1 μm CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.

\* cited by examiner

DEPOSITION OF SILICON LAYERS FOR ACTIVE MATRIX LIQUID CRYSTAL DISPLAY (AMLCD) APPLICATIONS

This application claims priority from U.S. Provisional Application Ser. No. 60/368,402 filed Mar. 26, 2002 entitled, "Deposition Of Gate Dielectric Layers For Active Matrix Liquid Crystal Display (AMLCD) Applications."

BACKGROUND OF THE INVENTION

1. Field of the Invention

Embodiments of the present invention relate to methods of silicon layer deposition and, more particularly, to methods of silicon layer formation using cyclical deposition techniques for active matrix liquid crystal display (AMLCD) applications.

2. Description of the Background Art

Active matrix liquid crystal displays have eliminated many problems associated with passive displays. For example, the fabrication of active matrix liquid crystal displays have enabled display screens to achieve greater brightness, enhanced readability, a greater variety of color shades, and broader viewing angles compared to displays that employ other technologies. Active matrix liquid crystal displays have therefore become the display technology of choice for numerous applications including computer monitors, television screens, camera displays, avionics displays, as well as numerous other applications.

Active matrix liquid crystal displays generally comprise an array of picture elements called pixels. An electronic switch is associated with each pixel in the display to control the operation thereof. Various electronic switches such as, for example, thin film transistors, and organic light emitting diodes (OLED), among others have been investigated to control pixel operation. Thin film transistors, in particular, offer a high degree of design flexibility and device performance.

Thin film transistors are generally formed on large area substrates having a high degree of optical transparency such as, for example, glass. FIG. 1 depicts a cross-sectional schematic view of a thin film transistor 22 being a type that has a bottom gate structure. The thin film transistor 22 includes a glass substrate 1 having an underlayer 2 formed on the surface thereof. A gate is formed on the underlayer 2. The gate comprises a gate metal layer 4 and a gate dielectric 8. The gate controls the movement of charge carriers in the transistor. A gate dielectric 8 formed over the gate metal layer 4 electrically isolates the gate from semiconductor layers 10, 14a, 14b, formed thereon, each of which may function to provide charge carriers to the transistor. A source region 18a of the transistor is formed on semiconductor layer 14a and a drain region 18b of the transistor is formed on semiconductor layer 14b. Finally, a passivation layer 20 encapsulates the thin film transistor 22 to protect it from environmental hazards such as moisture and oxygen.

Many thin film transistors use silicon for the semiconductor layers 10, 14a, 14b. Amorphous silicon, in particular, is widely employed because it is easy to deposit at low temperatures using techniques such as, for example, plasma enhanced chemical vapor deposition (PECVD). Unfortunately, it is difficult to deposit amorphous silicon layers that are continuous (e.g., without gaps or voids) using PECVD techniques. Amorphous silicon layers also tend to have a lower electron mobility. A low electron mobility for the amorphous silicon may limit the speed of transistors formed therefrom.

As such, polycrystalline silicon has been actively investigated as a substitute for amorphous silicon in thin film transistors. Polycrystalline silicon also has an electron mobility several orders of magnitude greater than that of amorphous silicon, which allows for the formation of fast-switching thin film transistors.

Unfortunately, conventional plasma enhanced chemical vapor deposition (PECVD) techniques used to form polycrystalline silicon tend to be high temperature processes. High deposition temperatures may not be compatible with the glass substrates upon which the thin film transistors are formed, since the glass tends to soften and become dimensionally unstable.

To circumnavigate this problem, some transistor fabrication processes form polycrystalline silicon by first depositing a layer of amorphous silicon at relatively low temperatures and then annealing the layer using a laser or a furnace to convert the amorphous silicon to polycrystalline silicon. While the electron mobility is higher for polycrystalline silicon films formed using an annealing process than for an amorphous silicon film, the electron mobility of such films is still lower than the electron mobility for polycrystalline silicon films directly deposited on a substrate from a plasma enhanced chemical vapor deposition (PECVD) process. Furthermore, annealing requires an additional step, thereby reducing the process throughput of thin film transistor fabrication processes.

Therefore, a need exists to develop a method of forming silicon layers for use in thin film transistors.

SUMMARY OF THE INVENTION

A method of silicon layer deposition for thin film transistor applications for use in active matrix liquid crystal displays (AMLCD) is described. A silicon layer is deposited using a cyclical deposition process. The cyclical deposition process comprises alternately adsorbing a silicon-containing precursor and a reducing gas on a substrate structure. The adsorbed silicon-containing precursor reacts with the adsorbed reducing gas to form the silicon layer on the substrate.

The method of silicon layer deposition formed with the cyclical deposition process may also be used in conjunction with other deposition processes. For example, a silicon seed layer may be formed on a substrate using a cyclical deposition process followed by a bulk silicon layer formed using a chemical vapor deposition (CVD) process.

Thin film transistors, such as for example a bottom-gate transistor or a top-gate transistor, including one or more silicon layers may be formed using such cyclical deposition techniques. In one embodiment, a preferred process sequence for fabricating a bottom-gate transistor includes providing a substrate having a gate comprising a gate metal layer and a gate dielectric layer formed thereon. One or more silicon layers are deposited on the gate dielectric layer. The one or more silicon layers may comprise, for example, a source region and/or a drain region of the transistor. The one or more silicon layers are formed by alternately adsorbing a silicon-containing precursor and a reducing gas on the substrate. The adsorbed silicon-containing precursor reacts with the adsorbed reducing gas to form the silicon layer on the substrate. Thereafter, the bottom-gate transistor may be completed by depositing a passivation layer on the substrate.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
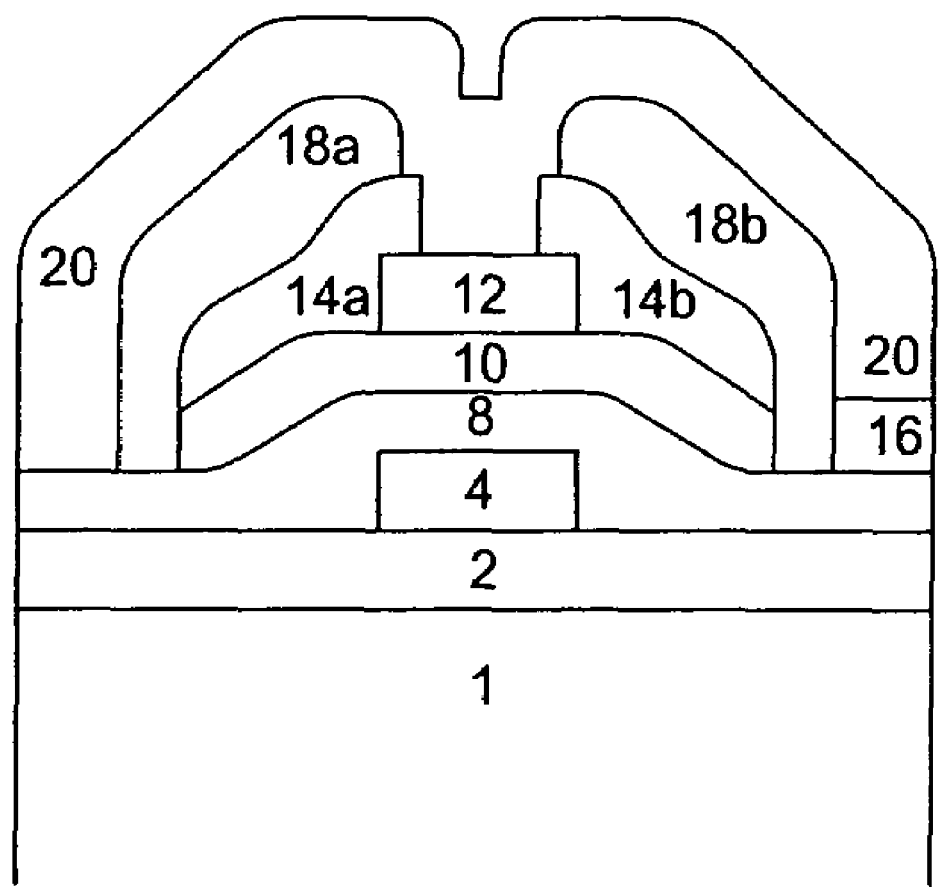
FIG. 1 depicts a cross-sectional schematic view of a prior art bottom-gate thin film transistor.
Figure 2:
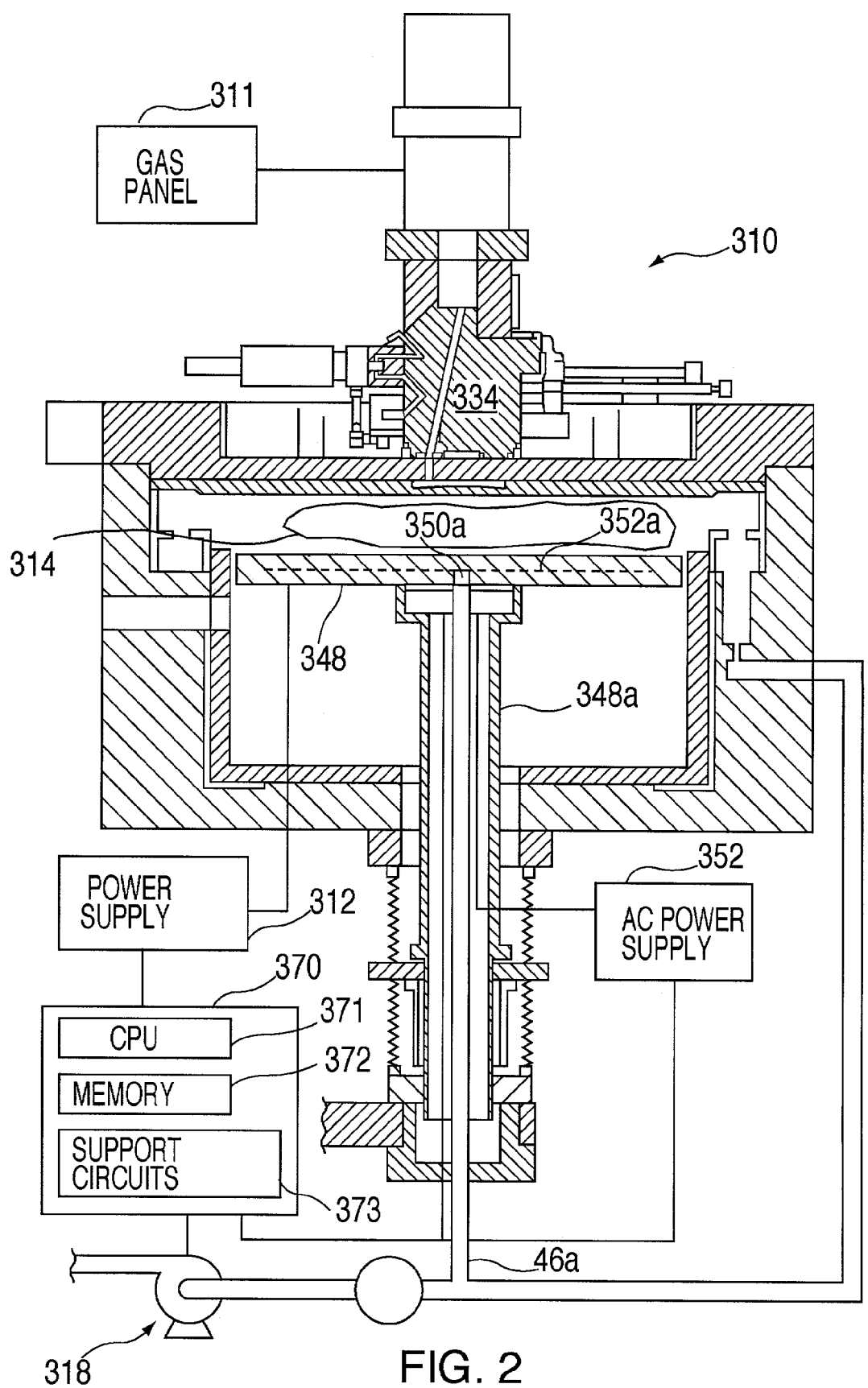
FIG. 2 depicts a schematic, cross-sectional view of a process chamber that can be used to practice embodiments described herein.

FIG. 2 depicts a schematic cross-sectional view of a process chamber 310 that can be used to perform integrated circuit fabrication in accordance with embodiments described herein. The process chamber 310 generally houses a substrate support pedestal 348, which is used to support a substrate (not shown). The substrate support pedestal 348 is movable in a vertical direction inside the process chamber 310 using a displacement mechanism 348a.

Depending on the specific process, the substrate can be heated to some desired temperature prior to or during deposition. For example, the substrate support pedestal 348 may be heated using an embedded heater element 352a. The substrate support pedestal 348 may be resistively heated by applying an electric current from an AC power supply 352 to the heater element 352a. The substrate (not shown) is, in turn, heated by the pedestal 348. Alternatively, the substrate support pedestal 348 may be heated using radiant heaters such as, for example, lamps (not shown).

A temperature sensor 350a, such as a thermocouple, is also embedded in the substrate support pedestal 348 to monitor the temperature of the pedestal 348 in a conventional manner. The measured temperature is used in a feedback loop to control the AC power supply 352 for the heating element 352a, such that the substrate temperature can be maintained or controlled at a desired temperature which is suitable for the particular process application.

A vacuum pump 318 is used to evacuate the process chamber 310 and to maintain the pressure inside the process chamber 310. A gas manifold 334, through which process gases are introduced into the process chamber 310, is located above the substrate support pedestal 348. The gas manifold 334 is connected to a gas panel 311, which controls and supplies various process gases to the process chamber 310.

Proper control and regulation of the gas flows to the gas manifold 334 are performed by mass flow controllers (not shown) and a microprocessor controller 370. The gas manifold 334 allows process gases to be introduced and uniformly distributed in the process chamber 310. Additionally, the gas manifold 334 may optionally be heated to prevent condensation of the any reactive gases within the manifold.

The gas manifold 334 includes a plurality of electronic control valves (not shown). The electronic control valves as used herein refer to any control valve capable of providing rapid and precise gas flow to the process chamber 310 with valve open and close cycles of less than about 1-2 seconds, and more preferably less than about 0.1 second.

The microprocessor controller 370 may be one of any form of general purpose computer processor (CPU) 371 that can be used in an industrial setting for controlling various chambers and sub-processors. The computer may use any suitable memory 372, such as random access memory, read only memory, floppy disk drive, hard disk, or any other form of digital storage, local or remote. Various support circuits 373 may be coupled to the CPU for supporting the processor in a conventional manner. Software routines as required may be stored on the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Alternatively, process chamber 310 may be adapted to generate an electric field therein. The electric field may be applied to one or more of the process gases introduced into the process chamber 310 through the gas manifold 334. For example, a high frequency power supply 312 may be coupled to the substrate support pedestal 348. The high frequency power supply 312 may be a radio frequency (RF) power supply with a frequency of, for example, about 13.56 MHz.

An electric field may be generated within the process chamber 310 by applying a high frequency power to the substrate support pedestal 348. The electric field may be used to ignite a process gas, such as, for example a reducing gas, forming a plasma 314 within the process chamber 310. The plasma 314 is believed to enhance the reaction between adsorbed process gases on a substrate positioned on the substrate support pedestal 348. The plasma may optionally be generated in a remote plasma chamber (not shown) that may then be introduced into the process chamber 310 through the gas manifold 334.

Silicon Layer Formation

A method of silicon layer deposition for thin film transistor applications is described. The silicon layer is deposited using a cyclical deposition process. The cyclical deposition process comprises alternately adsorbing a silicon-containing precursor and a reducing gas on a substrate structure. The silicon-containing precursor and the reducing gas react to form a silicon layer on the substrate.

Figure 3:
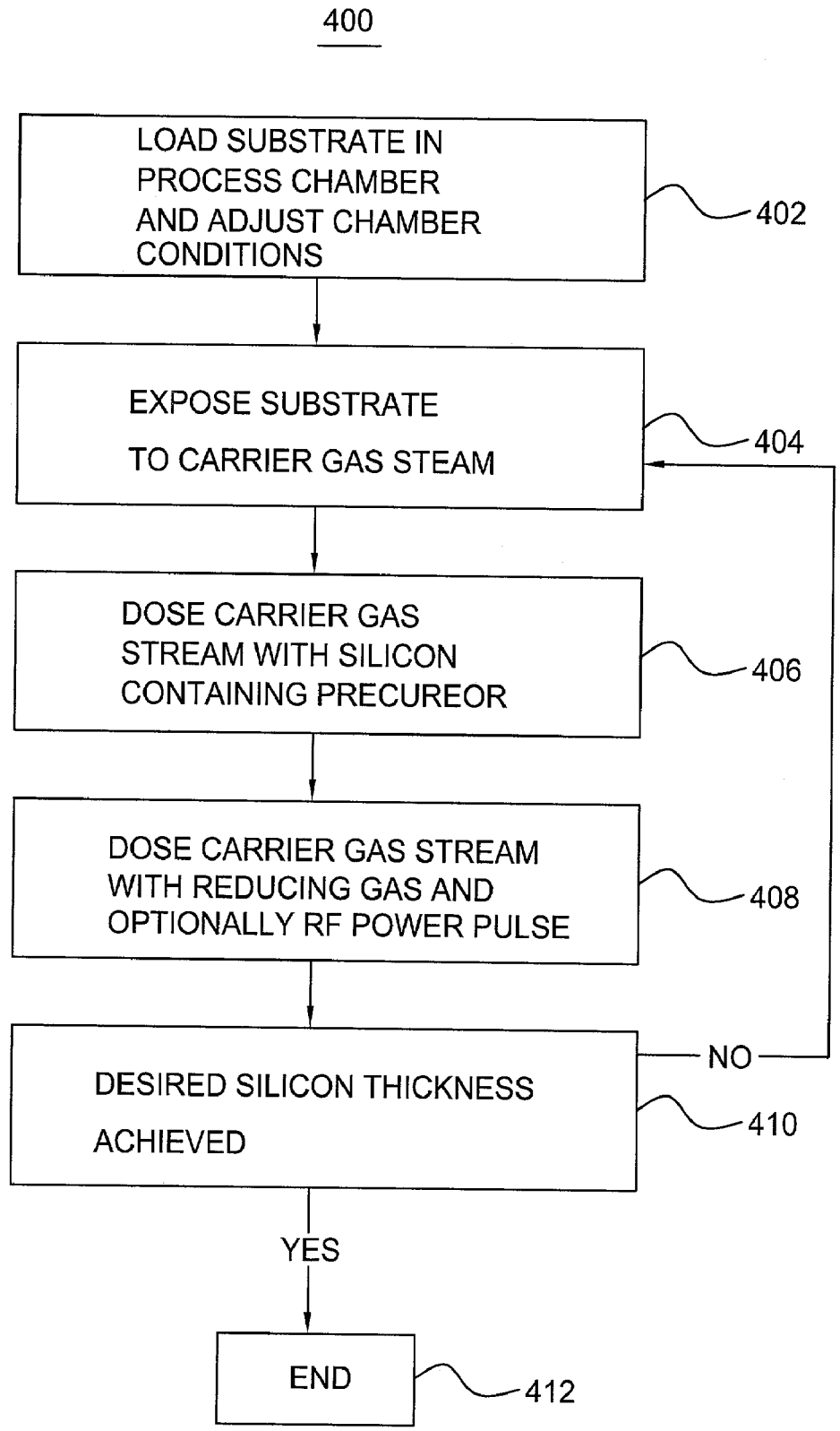
FIG. 3 illustrates a process sequence for silicon layer formation using cyclical deposition techniques according to one embodiment described herein.

FIG. 3 illustrates a process sequence 400 detailing the various steps used for the deposition of the silicon layer. These steps may be performed in a process chamber similar to that described above with reference to FIG. 2. As shown in step 402, a substrate is provided to the process chamber. The substrate may be for example, a glass or clear plastic material suitable for AMLCD fabrication. The process chamber conditions such as, for example, the temperature and pressure are adjusted to enhance the adsorption of the process gases on the substrate to facilitate the reaction of the silicon-containing precursor and the reducing gas. In general, for silicon layer deposition, the substrate should be maintained at a temperature between about 100° C. and about 600° C. at a process chamber pressure of between about 10 millitorr and about 10 torr.

In one embodiment where a constant carrier gas flow is desired, a carrier gas stream is established within the process chamber as indicated in step 404. Carrier gases may be selected so as to also act as a purge gas for removal of volatile reactants and/or by-products from the process chamber. Carrier gases such as, for example, helium (He), argon (Ar), and combinations thereof, may be used.

Referring to step 406, after the carrier gas stream is established within the process chamber, a pulse of a silicon-containing precursor is added to the carrier gas stream. The term pulse as used herein refers to a dose of material injected into the process chamber or into the carrier gas stream. The pulse of the silicon-containing precursor lasts for a predetermined time interval. The silicon-containing precursor may comprise, for example, silane ($SiH_4$), disilane ($Si_2H_6$), silicon tetrachloride ($SiCl_4$), dichlorosilane ($Si_2Cl_2H_2$) and trichlorosilane ($SiCl_3H$), among others.

The time interval for the pulse of the silicon-containing precursor is variable depending upon a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the silicon-containing precursor provides a sufficient amount of precursor, such that at least a monolayer of the silicon-containing precursor is adsorbed on the substrate. Thereafter, excess silicon-containing precursor remaining in the chamber may be removed from the process chamber by the constant carrier gas stream in combination with the vacuum system.

In step 408, after the excess silicon-containing precursor has been sufficiently removed from the process chamber by the carrier gas stream to prevent co-reaction or particle formation with a subsequently provided process gas, a pulse of a reducing gas is added to the carrier gas stream. Suitable reducing gases may include, for example, hydrogen ($H_2$), borane ($BH_3$) and diborane ($B_2H_6$), among others.

The pulse of the reducing gas also lasts for a predetermined time interval. In general, the time interval for the pulse of the reducing gas should be long enough to provide a sufficient amount of the reducing gas for reaction with the silicon-containing precursor that is already adsorbed on the substrate. Thereafter, excess reducing gas is flushed from the process chamber by the carrier gas stream.

Alternatively, a high frequency power, such as an RF power, may be applied to the substrate support pedestal 348 (FIG. 2) coincident with the pulse of the reducing gas (step 408) to generate a plasma comprising the reducing gas within the process chamber. The plasma is believed to enhance the reaction between the adsorbed silicon-containing precursor on the substrate and the reducing gas. The application of the high frequency power to the substrate support chamber may last for the same predetermined time interval as the time interval for the pulse of the reducing gas. In general, for silicon layer deposition, a high frequency power of about 0.2 $W/mm^2$ to about 2 $W/mm^2$ may be applied to the substrate support pedestal.

Steps 404 through 408 comprise one embodiment of a deposition cycle for a silicon layer. For such an embodiment, a constant flow of carrier gas is provided to the process chamber modulated by alternating periods of pulsing and non-pulsing where the periods of pulsing alternate between the silicon-containing precursor and the reducing gas along with the carrier gas stream, while the periods of non-pulsing include only the carrier gas stream.

The time interval for each of the pulses of the silicon-containing precursor and the reducing gas may have the same duration. That is the duration of the pulse of the silicon-containing precursor may be identical to the duration of the pulse of the reducing gas. For such an embodiment, a time interval ($T_1$) for the pulse of the silicon-containing precursor is equal to a time interval ($T_2$) for the pulse of the reducing gas.

Alternatively, the time interval for each of the pulses of the silicon-containing precursor and the reducing gas may have different durations. That is the duration of the pulse of the silicon-containing precursor may be shorter or longer than the duration of the pulse of the reducing gas. For such an embodiment, a time interval ($T_1$) for the pulse of the silicon-containing precursor is different than a time interval ($T_2$) for the pulse of the reducing gas.

In addition, the periods of non-pulsing between each of the pulses of the silicon-containing precursor and the reducing gas may have the same duration. That is the duration of the period of non-pulsing between each pulse of the silicon-containing precursor and each pulse of the reducing gas is identical. For such an embodiment, a time interval ($T_3$) of non-pulsing between the pulse of the silicon-containing precursor and the pulse of the reducing gas is equal to a time interval ($T_4$) of non-pulsing between the pulse of the reducing gas and the pulse of the silicon-containing precursor. During the time periods of non-pulsing only the constant carrier gas stream is provided to the process chamber.

Alternatively, the periods of non-pulsing between each of the pulses of the silicon-containing precursor and the reducing gas may have different durations. That is the duration of the period of non-pulsing between each pulse of the silicon-containing precursor and each pulse of the reducing gas may be shorter or longer than the duration of the period of non-pulsing between each pulse of the reducing gas and the silicon-containing precursor. For such an embodiment, a time interval ($T_3$) of non-pulsing between the pulse of the silicon-containing precursor and the pulse of the reducing gas is different from a time interval ($T_4$) of non-pulsing between the pulse of the reducing gas and the pulse of the silicon-containing precursor. During the time periods of non-pulsing only the constant carrier gas stream is provided to the process chamber.

Additionally, the time intervals for each pulse of the silicon-containing precursor, the reducing gas and the periods of non-pulsing therebetween for each deposition cycle may have the same duration. For such an embodiment, a time interval ($T_1$) for the silicon-containing precursor, a time interval ($T_2$) for the reducing gas, a time interval ($T_3$) of non-pulsing between the pulse of the silicon-containing precursor and the pulse of the reducing gas and a time interval ($T_4$) of non-pulsing between the pulse of the reducing gas and the pulse of the silicon-containing precursor each have the same value for each subsequent deposition cycle. For example, in a first deposition cycle ($C_1$), a time interval ($T_1$) for the pulse of the silicon-containing precursor has the same duration as the time interval ($T_1$) for the pulse of the silicon-containing precursor in subsequent deposition cycles ($C_2 \ldots C_N$). Similarly, the duration of each pulse of the reducing gas and the periods of non-pulsing between the pulse of the silicon-containing precursor and the reducing gas in deposition cycle ($C_1$) is the same as the duration of each pulse of the reducing gas and the periods of non-pulsing between the pulse of the silicon-containing precursor and the reducing gas in subsequent deposition cycles ($C_2 \ldots C_N$), respectively.

Alternatively, the time intervals for at least one pulse of the silicon-containing precursor, the reducing gas and the periods of non-pulsing therebetween for one or more of the deposition cycles of the silicon layer deposition process may have different durations. For such an embodiment, one or more of the time intervals ($T_1$) for the pulses of the silicon-containing precursor, the time intervals ($T_2$) for the pulses of the reducing gas, the time intervals ($T_3$) of non-pulsing between the pulse of the silicon-containing precursor and the pulse of the reducing gas and the time intervals ($T_4$) of non-pulsing between the pulse of the reducing gas and the pulse of the silicon-containing precursor may have different values for one or more subsequent deposition cycles of the silicon layer deposition process. For example, in a first deposition cycle ($C_1$), the time interval ($T_1$) for the pulse of the silicon-containing precursor may be longer or shorter than the time interval ($T_1$) for the pulse of the silicon-containing precursor in a subsequent deposition cycle ($C_2 \ldots C_N$). Similarly, the duration of each pulse of the reducing gas and the periods of non-pulsing between the pulse of the silicon-containing precursor and the pulse of the reducing gas in deposition cycle ($C_1$) may be the same or different than the duration of each pulse of the reducing gas and the periods of non-pulsing between the pulse of the silicon-containing precursor and the reducing gas in subsequent deposition cycles ($C_2 \ldots C_N$), respectively.

Referring to step 410, after each deposition cycle (steps 404 through 408) a total thickness of the silicon layer will be formed on the substrate. Depending on specific device requirements, subsequent deposition cycles may be needed to achieve a desired thickness. As such, steps 404 through 408 are repeated until the desired thickness for the silicon layer is achieved. Thereafter, when the desired thickness for the silicon layer is achieved the process is stopped as indicated by step 412.

Figure 4:
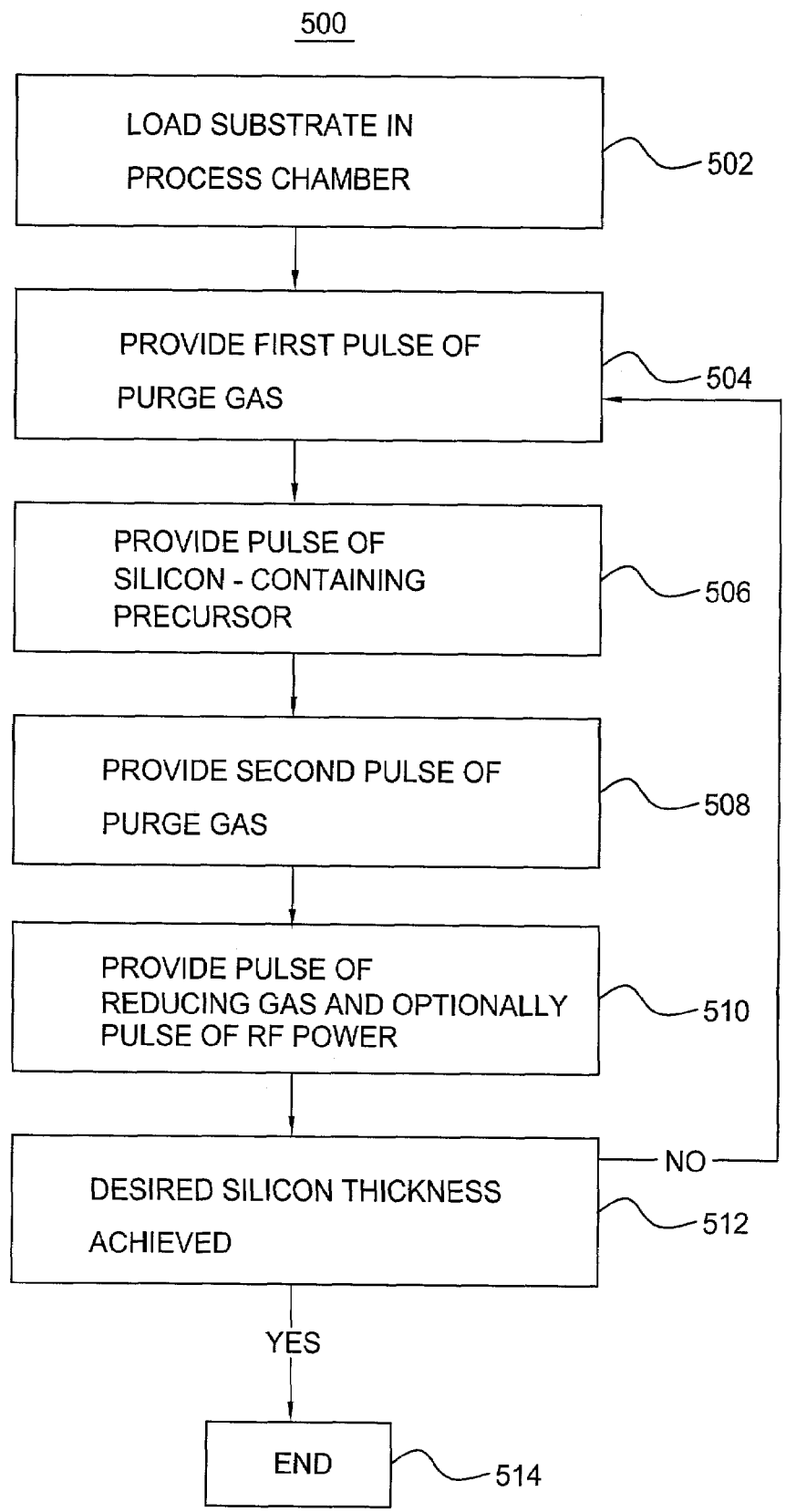
FIG. 4 illustrates a process sequence for silicon layer formation using cyclical deposition techniques according to an alternative embodiment described herein.

In an alternate process sequence described with respect to FIG. 4, the silicon layer deposition cycle comprises separate pulses for each of the silicon-containing precursor, the reducing gas, and a purge gas. For such an embodiment, the silicon layer deposition sequence 500 includes providing a substrate to the process chamber (step 502), providing a first pulse of a purge gas to the process chamber (step 504), providing a pulse of a silicon-containing precursor to the process chamber (step 506), providing a second pulse of the purge gas to the process chamber (step 508), providing a pulse of a reducing gas to the process chamber (step 510), and then repeating steps 504 through 510 or stopping the deposition process (step 514) depending on whether a desired thickness for the silicon layer has been achieved (step 512).

Alternatively, a high frequency power, such as an RF power, may be applied to the substrate support pedestal 348 (FIG. 2) coincident with the pulse of the reducing gas (step 510) to generate a plasma comprising the reducing gas within the process chamber. The plasma is believed to enhance the reaction between the adsorbed silicon-containing precursor on the substrate and the reducing gas. The application of the high frequency power to the substrate support chamber may last for the same predetermined time interval as the time interval for the pulse of the reducing gas. In general, for silicon layer deposition, a high frequency power of about 0.2 W/mm$^2$ to about 2 W/mm$^2$ may be applied to the substrate support pedestal.

The time intervals for each of the pulses of the silicon-containing precursor, the reducing gas and the purge gas may have the same or different durations as discussed above with respect to FIG. 3. Alternatively, the time intervals for at least one pulse of the silicon-containing precursor, the reducing gas and the purge gas for one or more of the deposition cycles of the silicon layer deposition process may have different durations.

In FIGS. 3-4, the silicon layer deposition cycle is depicted as beginning with a pulse of the silicon-containing precursor followed by a pulse of the reducing gas. Alternatively, the silicon layer deposition cycle may start with a pulse of the reducing gas followed by a pulse of the silicon-containing precursor.

The reducing gas may become incorporated, at least in part, into the silicon layer. For example, hydrogen present in the reducing gas may become bound to the silicon, thereby forming a hydrogenated silicon (Si:H) layer.

The method of silicon layer deposition formed with the cyclical deposition process described above with respect to FIGS. 3-4, may also be used in conjunction with other deposition processes. For example, a silicon seed layer may be formed on a substrate using a cyclical deposition process. The silicon seed layer may have a thickness of less than about 50 Å. Thereafter, a bulk silicon layer may be formed on the silicon seed layer using a chemical vapor deposition (CVD) process. The bulk silicon layer may have a thickness up to about 2000 Å.

One exemplary process of depositing a silicon layer comprises alternately providing pulses of silane ($SiH_4$) and pulses of hydrogen ($H_2$). The silane ($SiH_4$) may be provided to an appropriate flow control valve, for example, an electronic flow control valve, at a flow rate of between about 10 sccm (standard cubic centimeters per minute) and about 100 sccm, and thereafter pulsed for about 0.5 seconds or less. A carrier gas comprising argon (Ar) is provided along with the silane at a flow rate between about 10 sccm to about 100 sccm. The hydrogen ($H_2$) may be provided to an appropriate flow control valve, for example, an electronic flow control valve, at a flow rate of between about 10 sccm and about 1000 sccm, and thereafter pulsed for about 0.5 seconds or less. A carrier gas comprising argon (Ar) is provided along with the reducing gas at a flow rate between about 10 sccm to about 1000 sccm. The substrate may be maintained at a chamber pressure between about 10 millitorr to about 10 torr. The above mentioned flow rates for the carrier gas, the silicon-containing precursor, and the reducing gas may be varied, depending upon the volume capacity of the process chamber 310.

The substrate temperature determines whether amorphous silicon or polycrystalline silicon material is formed. For example, if the substrate temperature is maintained between about 100° C. to about 400° C., an amorphous silicon layer is deposited on the substrate. However, if the substrate temperature is maintained between about 400° C. to about 600° C., a polycrystalline silicon layer will be deposited on the substrate. Furthermore, the amorphous silicon layer may be optionally converted to a polysilicon layer using, for example, a laser annealing process or a metal induced crystallization process, among others.

Another exemplary process of depositing a silicon layer comprises alternately providing pulses of a silicon-containing precursor, pulses of a dopant compound and pulses of a reducing gas. In one embodiment, the dopant compound may be mixed with the silicon-containing precursor and pulses of the silicon-containing precursor/dopant compound may be provided to the process chamber. The dopant compound may be an n-type dopant or a p-type dopant for the silicon layer. Each pulse of the silicon-containing precursor/dopant compound may comprise about 1% to about 10% of the dopant compound.

Figure 5A:
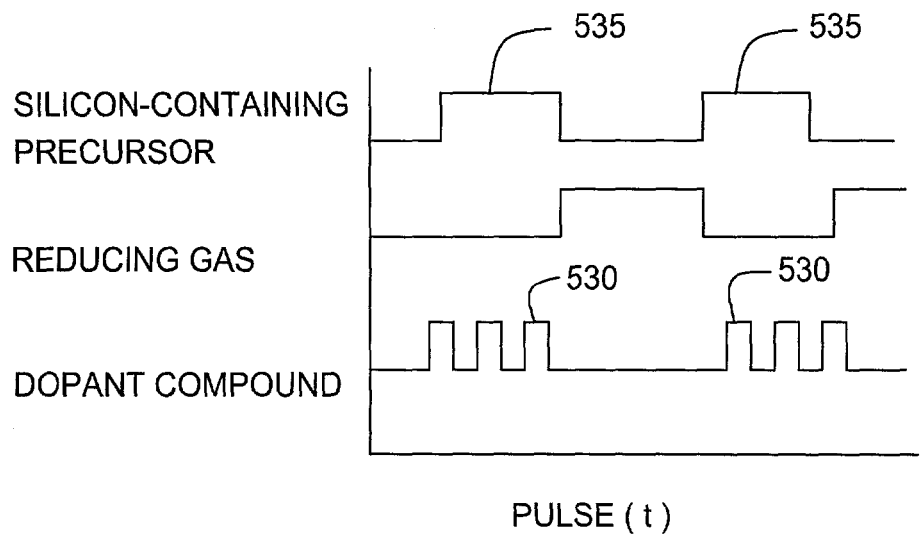
FIGS. 5A-5B depict alternate embodiments of cyclical deposition techniques according to embodiments described herein including one or more pulses of a dopant compound.

Referring to FIG. 5A, one or more pulses of the dopant compound 530 may be provided coincident with the pulses of the silicon-containing precursor 535. The time duration for each pulse of the dopant compound may last for a predetermined time interval that is less than the time interval for the pulse of the silicon-containing precursor, such that more than one pulse of the dopant compound may be provided coincident with a pulse of the silicon-containing precursor. The flow rate for the one or more pulses of the dopant compound may be, for example, about 1% to about 10% of the flow rate for the pulse of the silicon-containing precursor.

Figure 5B:
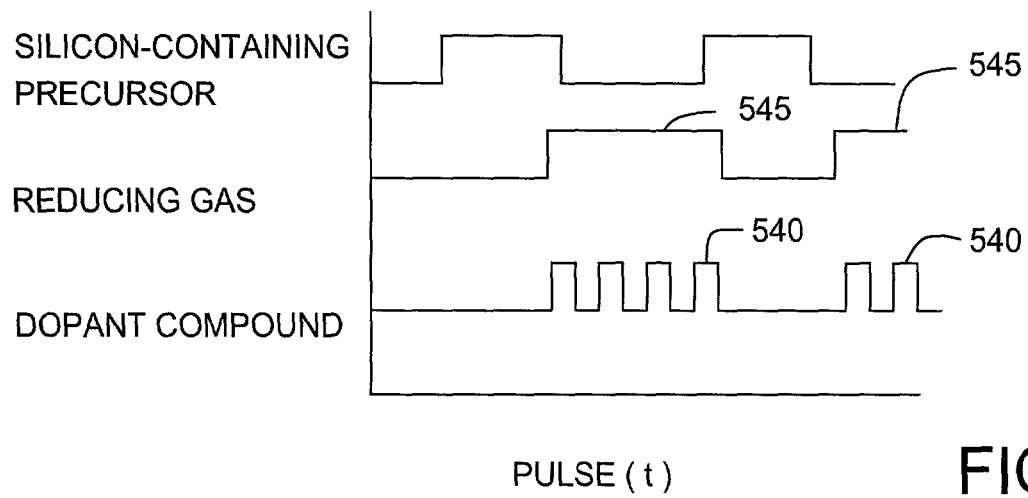

Alternatively, referring to FIG. 5B, one or more pulses of the dopant compound 540 may be provided coincident with the pulses of the reducing gas 545. The time duration for each pulse of the dopant compound may last for a predetermined time interval that is less than the time interval for the pulse of the reducing gas, such that more than one pulse of the dopant compound may be provided coincident with a pulse of the reducing gas. The flow rate for the one or more pulses of the dopant compound may be, for example, about 1% to about 10% of the flow rate for the pulse of the reducing gas.

Suitable n-type dopant compounds include, for example, arsenic-based compounds and phosphorus-based compounds, such as arsine ($AsH_3$) and phosphine ($PH_3$), among others. Suitable p-type dopant compounds include, for example, boron-based compounds such as, boron trihydride ($BH_3$), among others.

Integrated Circuit Fabrication Processes

1. Bottom-Gate Thin Film Transistor

Figure 6A:
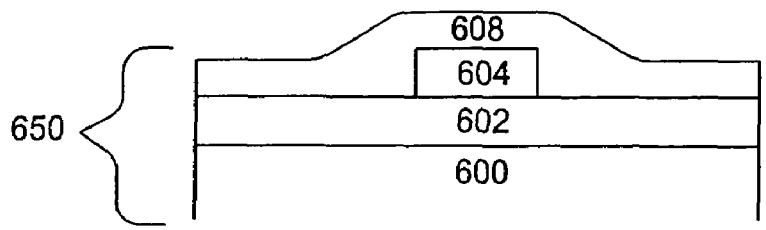
FIGS. 6A-6D depict cross-sectional views of a substrate at different stages of a bottom-gate thin film transistor fabrication sequence.

FIGS. 6A-6D illustrate cross-sectional schematic views of substrate structure 650 during different stages of a bottom-gate thin film transistor fabrication sequence incorporating a silicon layer formed using a cyclical deposition process. This transistor fabrication sequence is for a switch in an active matrix liquid crystal display (AMLCD) and this process depicts the formation of one of an array of switches used in an AMLCD. FIG. 6A, for example, illustrates a cross-sectional view of a substrate 600. The substrate 600 may comprise a material that is essentially optically transparent in the visible spectrum, such as, for example, glass or clear plastic, including soda-lime glass, borosilicate glass, or quartz glass. The substrate may be of varying shapes or dimensions. Typically, for thin film transistor applications, the substrate is a glass substrate with dimensions greater than about 500 mm×500 mm.

The substrate 600 may have an underlayer 602 thereon. The underlayer 602 may be an insulating material, for example, such as silicon dioxide ($SiO_2$) or silicon nitride (SiN). The underlayer 602 may be formed using conventional deposition techniques.

A gate metal layer 604 is formed on the underlayer 602. The gate metal layer 604 comprises an electrically conductive layer that controls the movement of charge carriers within the thin film transistor. The gate metal layer 604 may comprise a metal such as, for example, aluminum (Al), tungsten (W), chromium (Cr), tantalum (Ta), or combinations thereof, among others. The gate metal layer 604 may be formed using conventional deposition, lithography and etching techniques.

A gate dielectric layer 608 is formed on the gate metal layer 604. The gate dielectric layer 608 may comprise, for example, silicon dioxide ($SiO_2$), silicon nitride (SiN), aluminum oxide ($Al_2O_3$), tantalum oxide ($Ta_2O_5$), among others. Typically the gate dielectric material 608 has a thickness in the range of about 20 Angstroms to about 5000 Angstroms.

Figure 6B:
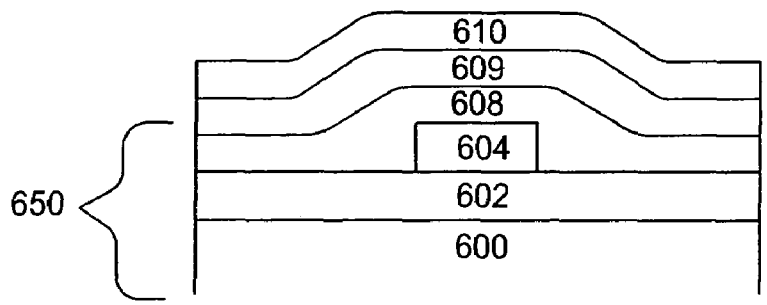

Referring to FIG. 6B, a silicon bulk layer 610 is deposited on the gate dielectric layer 608. The silicon bulk layer 610 may comprise amorphous silicon deposited using an embodiment of the cyclical deposition technique described above with reference to FIGS. 3-4. Silicon bulk layer 610 may be deposited to a thickness within a range of about 20 Angstroms to about 2000 Angstroms. The cyclical deposition techniques employed for the silicon bulk layer 610 deposition provide conformal step coverage on the gate dielectric material 608.

Alternatively, a silicon seed layer 609 may be deposited prior to the silicon bulk layer 610 deposition. For such an embodiment, the silicon seed layer may be formed using an embodiment of the cyclical deposition techniques described above with reference to FIGS. 3-4. Following the deposition of the silicon seed layer 609, the silicon bulk layer 610 may be deposited thereon using conventional deposition techniques such as, for example, chemical vapor deposition (CVD) or plasma enhanced chemical vapor deposition (PECVD).

Figure 6C:
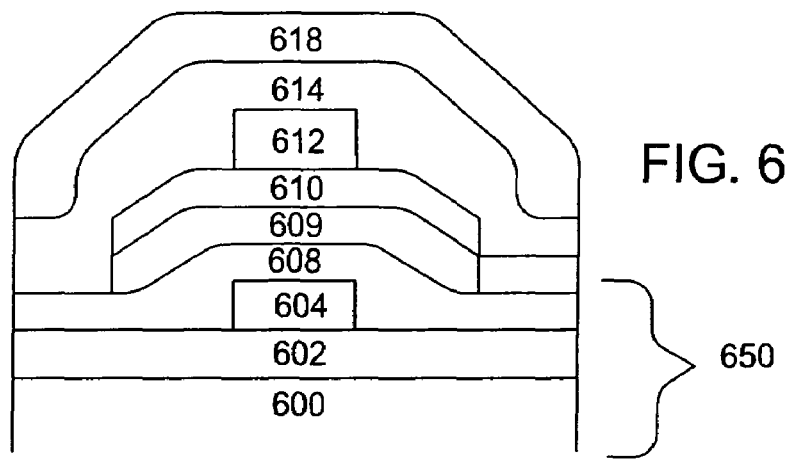

Referring to FIG. 6C, an etch stop layer 612 may be deposited on silicon bulk layer 610. The etch stop layer 612 may comprise an insulating material such as, for example, silicon nitride (SiN). The etch stop layer 612 may be formed using, for example, plasma enhanced chemical vapor deposition, chemical vapor deposition, physical vapor deposition, or other conventional methods known to the art. The etch stop layer 612 and the silicon bulk layer 610 are lithographically patterned and etched using conventional techniques.

A doped silicon layer 614 is formed on the patterned etch stop layer 612 and silicon bulk layer 610. The doped silicon layer 614 may be deposited using an embodiment of the cyclical deposition process described above with reference to FIGS. 3-5. The doped silicon layer 614 may be deposited to a thickness within a range of about 10 Angstroms to about 100 Angstroms. The cyclical deposition techniques employed for the doped silicon layer 614 deposition provide conformal step coverage on the patterned etch stop layer 612 and the silicon bulk layer 610. The doped silicon layer 614 directly contacts portions of the silicon bulk layer 610, forming a semiconductor junction.

A conductive layer 618 is formed on the doped silicon layer 614. Conductive layer 618 may comprise a metal such as, for example, aluminum (Al), tungsten (W), molybdenum (Mo), chromium (Cr), tantalum (Ta), and combinations thereof, among others. The conductive layer 618 may be formed using conventional deposition techniques.

Figure 6D:
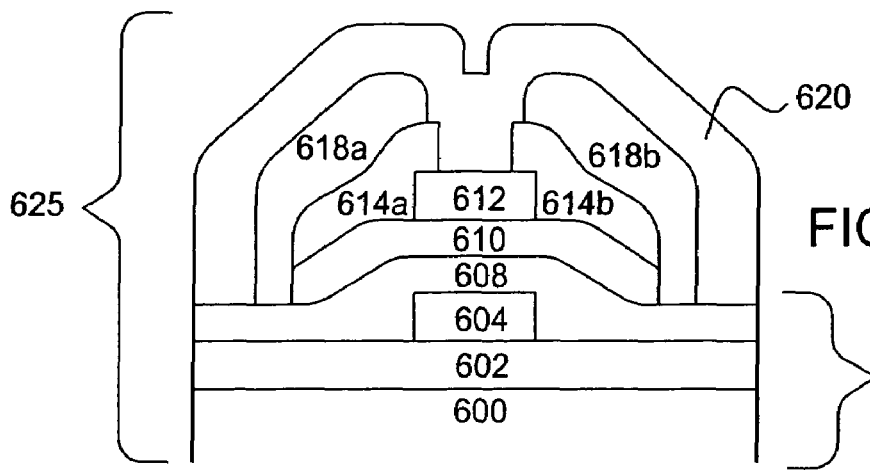

Referring to FIG. 6D, both the conductive layer 618 and the doped silicon layer 614 may be lithographically patterned to define a source region 614a and a drain region 614b as well as a source contact 618a and a drain contact 618b. The source 614a and drain 614b regions of the thin film transistor are separated from one another by the stop etch layer 612.

Thereafter, a passivation layer 620 may be deposited atop the substrate structure 650. Passivation layer 620 conformally coats exposed surfaces of gate dielectric layer 608, source contact 618a, drain contact 618b and etch stop layer 612. The passivation layer 620 is generally an insulator and may comprise, for example, silicon oxide or silicon nitride. The passivation layer 620 may be formed using conventional deposition techniques.

2. Top-Gate Thin Film Transistor

FIGS. 7A-7D illustrate cross-sectional schematic views of substrate structure 750 during different stages of a top-gate thin film transistor fabrication sequence incorporating a silicon layer formed using a cyclical deposition process. The top-gate thin film transistor may be, for example, a metal-oxide-semiconductor field effect transistor (MOSFET) or a junction field effect transistor (JFET). This transistor fabrication sequence is for a switch in an active matrix liquid crystal display (AMLCD) and this process depicts the formation of one of an array of switches used in an AMLCD.

Figure 7A:
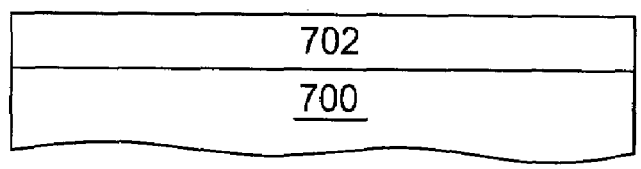
FIGS. 7A-7D depict cross-sectional views of a substrate at different stages of a top-gate thin film transistor fabrication sequence.

FIG. 7A, for example, illustrates a cross-sectional view of a substrate 700. The substrate may comprise a material that is essentially optically transparent in the visible spectrum, such as, for example, glass or clear plastic, including soda-lime glass, borosilicate glass, or quartz. The substrate may have an underlayer 702 thereon. The underlayer 702 may be an insulating material, such as, for example, silicon dioxide ($SiO_2$) or silicon nitride (SiN).

Figure 7B:
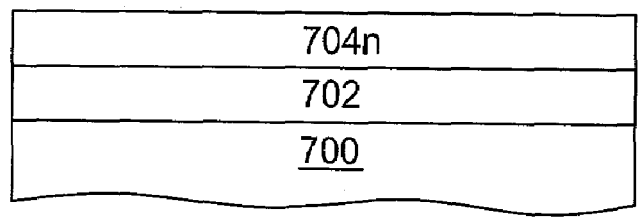

Referring to FIG. 7B, an n-type doped silicon layer 704n is deposited on the underlayer 702. The n-type doped silicon layer 704n may be formed using an embodiment of the cyclical deposition process described above with reference to FIGS. 3-5. Alternatively, the silicon layer may be a p-type doped layer.

Figure 7C:
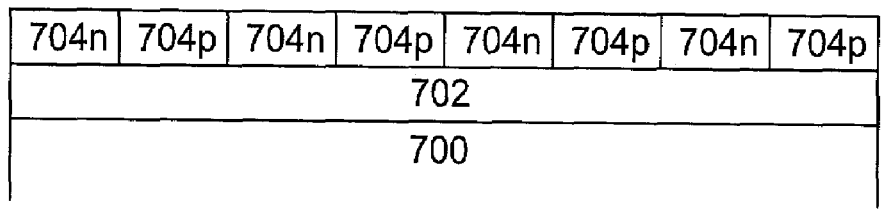

After the n-type doped silicon layer 704n is formed selected portions thereof are ion implanted to form p-type doped regions 704p adjacent to n-type doped regions 704n, as shown in FIG. 7C. The interfaces between n-type regions 704n and p-type regions 704p are semiconductor junctions that support the ability of the thin film transistor to act as a switching device. By ion doping portions of semiconductor layer 704, one or more semiconductor junctions are formed, with an intrinsic electrical potential present across each junction.

Figure 7D:
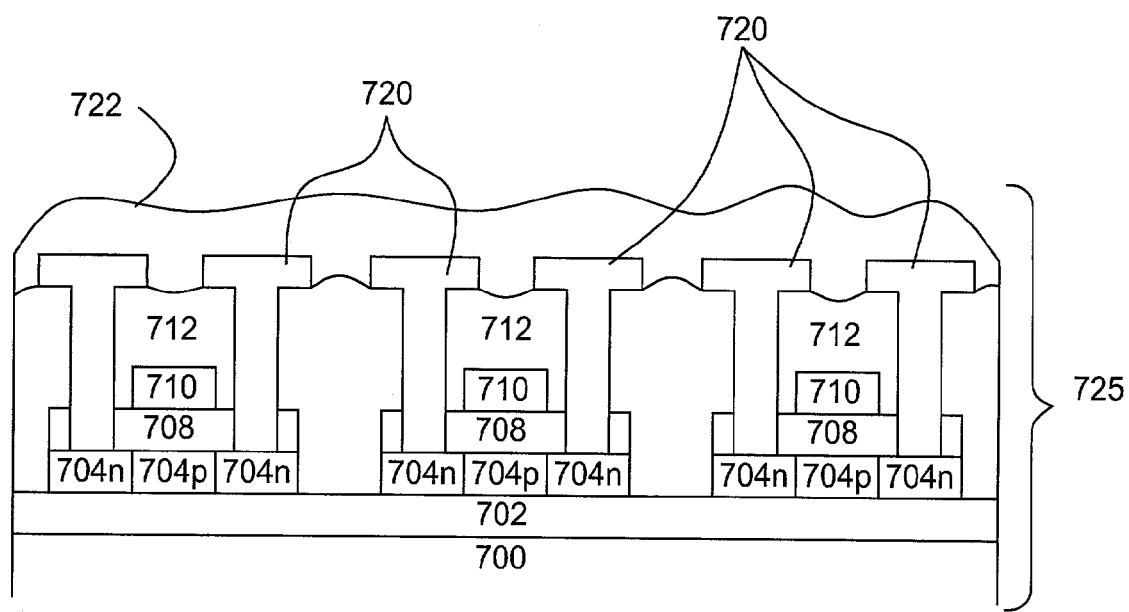

Referring to FIG. 7D, a gate dielectric layer 708 is deposited on the n-type doped regions 704n and the p-type doped regions 704p. The gate dielectric layer 708 may comprise, for example, silicon dioxide ($SiO_2$), silicon nitride (SiN), aluminum oxide ($Al_2O_3$), and tantalum pentoxide ($Ta_2O_5$), among others. The gate dielectric layer 708 may be formed using conventional deposition processes.

A gate metal layer 710 is deposited on the gate dielectric layer 708. The gate metal layer 710 comprises an electrically conductive layer that controls the movement of charge carriers within the thin film transistor. The gate metal layer 710 may comprise a metal such as, for example, aluminum (Al), tungsten (W), chromium (Cr), tantalum (Ta), or combinations thereof, among others. The gate metal layer 710 may be formed using conventional deposition techniques. After deposition, the gate metal layer 710 is patterned to define gates using conventional lithography and etching techniques.

After the gate metal layer 710 is formed, an interlayer dielectric 712 is formed thereon. The interlayer dielectric 712 may comprise, for example, an oxide such as silicon dioxide. Interlayer dielectric 712 may be formed using conventional deposition processes.

The interlayer dielectric 712 is patterned to expose the n-type doped regions 704n and the p-type doped regions 704p. The patterned regions of the interlayer dielectric 712 are filled with a conductive material to form contacts 720. The contacts 720 may comprise a metal such as, for example, aluminum (Al), tungsten (W), molybdenum (Mo), chromium (Cr), tantalum (Ta), and combinations thereof, among others. The contacts 720 may be formed using conventional deposition techniques.

Thereafter, a passivation layer 722 may be formed thereon in order to protect and encapsulate a completed thin film transistor 725. The passivation layer 722 is generally an insulator and may comprise, for example, silicon oxide or silicon nitride. The passivation layer 722 may be formed using conventional deposition techniques.

While FIGS. 7A-7D as well as the supporting discussion provide an embodiment in which the doped silicon layer 704 is an n-type silicon layer with p-type dopant ions implanted therein, one skilled in the art will recognize that other configurations are within the scope of the invention. For example, one may deposit a p-type silicon layer and implant n-type dopant ions in regions thereof.

Furthermore, it is within the scope of the invention to form other devices that have configurations of semiconductor layers that are different from those described with respect to FIGS. 6-7. For example, the switch for an AMLCD may be any variety of bipolar or unipolar transistor devices wherein a silicon layer is deposited using the cyclical deposition process described herein.

While the foregoing is directed to the preferred embodiment of the present invention, other and further embodiments of the invention may be devised without departing from the basic scope thereof, and the scope thereof is determined by the claims that follow.

What is claimed is:

1. A method of forming a transistor for use in an active matrix liquid crystal display (AMLCD), comprising:
   (a) providing a substrate;
   (b) depositing one or more silicon layers on the substrate using a cyclical deposition process comprising a plurality of cycles, wherein each cycle comprises establishing a flow of an inert gas in a process chamber and modulating the flow of the inert gas with alternating periods of exposure to a silicon-containing precursor and a reducing gas; and
   (c) forming a gate metal layer on at least one of the one or more silicon layers.

2. The method of claim 1 wherein the silicon-containing precursor comprises a compound selected from the group consisting of silane ($SiH_4$), disilane ($Si_2H_6$), silicon tetrachloride ($SiCl_4$, dichlorosilane ($SiCl_2H_2$) and trichlorosilane ($SiCl_3H$).

3. The method of claim 1 wherein the reducing gas is selected from the group consisting of hydrogen ($H_2$), borane ($BH_3$) and diborane ($B_2H_6$).

4. The method of claim 1 wherein one or more dopant compounds are adsorbed on the substrate along with one of either the silicon-containing precursor and the reducing gas.

5. The method of claim 4 wherein the one or more dopant compounds are selected from the group consisting of arsine, phosphine and boron trihydride.

6. The method of claim 4 further comprising ion-implanting portions of the doped one or more silicon semiconductor layers in order to form a semiconductor junction.

7. The method of claim 1 wherein the silicon layer deposition is performed at a temperature between about 100° C. and about 600° C.

8. The method of claim 1 wherein one of the one or more silicon layers comprises a source region of the transistor.

9. The method of claim 1 wherein one of the one or more silicon layers comprises a drain region of the transistor.

10. The method of claim 1 further comprising forming a gate dielectric layer on the gate metal layer.

11. The method of claim 1 wherein the reducing gas comprises a plasma.

12. The method of claim 1 wherein the one or more silicon layers of step (b) are silicon seed layers and a silicon bulk layer is formed thereon.

13. A method of forming a transistor for use in an active matrix liquid crystal display (AMLCD), comprising:
providing a substrate; and
depositing one or more silicon layers on the substrate using a cyclical deposition process comprising a plurality of cycles, wherein each cycle comprises establishing a flow of an inert gas in a process chamber and modulating the flow of the inert gas with alternating periods of exposure to a silicon-containing precursor and a reducing gas.

14. The method of claim 13 wherein the period of exposure to the silicon-containing precursor, the period of exposure to the reducing gas, a period of flow of the inert gas between the period of exposure to the silicon-containing precursor and the period of exposure to the reducing gas, and a period of flow of the inert gas between the period of exposure to the reducing gas and the period of exposure to the silicon-containing precursor each have the same duration.

15. The method of claim 13 wherein at least one of the period of exposure to the silicon-containing precursor, the period of exposure to the reducing gas, a period of flow of the inert gas between the period of exposure to the silicon-containing precursor and the period of exposure to the reducing gas, and a period of flow of the inert gas between the period of exposure to the reducing gas and the period of exposure to the silicon-containing precursor has a different duration.

16. The method of claim 13 wherein the period of exposure to the silicon-containing precursor during each deposition cycle of the cyclical deposition process has the same duration.

17. The method of claim 13 wherein at least one period of exposure to the silicon-containing precursor for one or more deposition cycles of the cyclical deposition process has a different duration.

18. The method of claim 13 wherein the period of exposure to the reducing gas during each deposition cycle of the cyclical deposition process has the same duration.

19. The method of claim 13 wherein at least one period of exposure to the reducing gas for one or more deposition cycles of the cyclical deposition process has a different duration.

20. The method of claim 13 wherein a period of flow of the inert gas between the period of exposure to the silicon-containing precursor and the period of exposure to the reducing gas during each deposition cycle of the cyclical deposition process has the same duration.

21. The method of claim 13 wherein at least one period of flow of the inert gas between the period of exposure to the silicon-containing precursor and the period of exposure to the reducing gas for one or more deposition cycles of the cyclical deposition process has a different duration.

22. The method of claim 13 wherein a period of flow of the inert gas between the period of exposure to the reducing gas and the period of exposure to the silicon-containing precursor during each deposition cycle of the cyclical deposition process has the same duration.

23. The method of claim 13 wherein at least one period of flow of the inert gas between the period of exposure to the reducing gas and the period of exposure to the silicon-containing precursor for one or more deposition cycles of the cyclical deposition process has a different duration.

24. The method of claim 13 wherein the silicon-containing precursor comprises a compound selected from the group consisting of silane ($SiH_4$), disilane ($Si_2H_6$), silicon tetrachloride ($SiCl_4$), dichlorosilane ($SiCl_2H_2$), and trichlorosilane ($SiCl_3H$).

25. The method of claim 13 wherein the reducing gas is selected from the group consisting of hydrogen ($H_2$), borane ($BH_3$) and diborane ($B_2H_6$).

26. The method of claim 13 wherein one or more dopant compounds are adsorbed on the substrate along with one of either the silicon-containing precursor and the reducing gas.

27. The method of claim 26 wherein the one or more dopant compounds are selected from the group consisting of arsine, phosphine and boron trihydride.

28. The method of claim 26 further comprising ion-implanting portions of the one or more silicon semiconductor layers in order to form a semiconductor junction.

29. The method of claim 13 wherein the silicon layer deposition is performed at a temperature between about 100° C. and about 600° C.

30. The method of claim 13 wherein the reducing gas comprises a plasma.

31. A method of forming a transistor for use in an active matrix liquid crystal display (AMLCD), comprising the steps of:
providing a substrate; and
depositing one or more silicon layers on the substrate using a cyclical deposition process, wherein the cyclical deposition process includes a plurality of cycles, wherein each cycle comprises establishing a flow of an inert gas in a process chamber and modulating the flow of the inert gas with alternating periods of exposure to a silicon-containing precursor and a reducing gas, wherein there is a period of flow of the inert gas between a period of exposure to the silicon-containing gas and a period of exposure to the reducing gas and a period of flow of the inert gas between a period of exposure to the reducing gas and the period of exposure to the silicon-containing gas, and wherein the period of exposure to the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor each have the same duration.

32. The method of claim 31 wherein the period of exposure to the silicon-containing precursor during each deposition cycle of the cyclical deposition process has the same duration.

33. The method of claim 31 wherein at least one period of exposure to the silicon-containing precursor for one or more deposition cycles of the cyclical deposition process has a different duration.

34. The method of claim 31 wherein the period of exposure to the reducing gas during each deposition cycle of the cyclical deposition process has the same duration.

35. The method of claim 31 wherein at least one period of exposure to the reducing gas for one or more deposition cycles of the cyclical deposition process has a different duration.

36. The method of claim 31 wherein a period of flow of the inert gas between the period of exposure to the silicon-containing precursor and the reducing gas during each deposition cycle of the cyclical deposition process has the same duration.

37. The method of claim 31 wherein at least one period of flow of the inert gas between the period of exposure to the silicon-containing precursor and the reducing gas during each deposition cycle of the cyclical deposition process has a different duration.

38. The method of claim 31 wherein a period of flow of the inert gas between the period of exposure to the reducing gas and the silicon-containing precursor during each deposition cycle of the cyclical deposition process has the same duration.

39. The method of claim 31 wherein at least one period of flow of the inert gas between the period of exposure to the reducing gas and the silicon-containing precursor for one or more deposition cycles of the cyclical deposition process has a different duration.

40. The method of claim 31 wherein one or more dopant compounds are adsorbed on the substrate along with one of either the silicon-containing precursor and the reducing gas.

41. The method of claim 31 wherein the reducing gas comprises a plasma.

42. A method of forming a transistor for use in an active matrix liquid crystal display (AMLCD), comprising the steps of:
providing a substrate; and
depositing one or more silicon layers on the substrate using a cyclical deposition process, wherein the cyclical deposition process includes a plurality of cycles, wherein each cycle comprises establishing a flow of an inert gas in a process chamber and modulating the flow of the inert gas with alternating periods of exposure to a silicon-containing precursor and a reducing gas, wherein there is a period of flow of the inert gas between a period of exposure to the silicon-containing gas and a period of exposure to the reducing gas and a period of flow of the inert gas between a period of exposure to the reducing gas and the period of exposure to the silicon-containing gas, and wherein at least one of the period of exposure the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor has a different duration.

43. The method of claim 42 wherein the period of exposure to the silicon-containing precursor during each deposition cycle of the cyclical deposition process has the same duration.

44. The method of claim 42 wherein at least one period of exposure to the silicon-containing precursor for one or more deposition cycles of the cyclical deposition process has a different duration.

45. The method of claim 42 wherein the period of exposure to the reducing gas during each deposition cycle of the cyclical deposition process has the same duration.

46. The method of claim 42 wherein at least one period of exposure to the reducing gas for one or more deposition cycles of the cyclical deposition process has a different duration.

47. The method of claim 42 wherein a period of flow of the inert gas between the period of exposure to the silicon-containing precursor and the reducing gas during each deposition cycle of the cyclical deposition process has the same duration.

48. The method of claim 42 wherein at least one period of flow of the inert gas between the period of exposure to the silicon-containing precursor and the reducing gas during each deposition cycle of the cyclical deposition process has a different duration.

49. The method of claim 42 wherein a period of flow of the inert gas between the period of exposure to the reducing gas and the silicon-containing precursor during each deposition cycle of the cyclical deposition process has the same duration.

50. The method of claim 42 wherein at least one period of flow of the inert gas between the period of exposure to the reducing gas and the silicon-containing precursor for one or more deposition cycles of the cyclical deposition process has a different duration.

51. The method of claim 42 wherein one or more dopant compounds are adsorbed on the substrate along with one of either the silicon-containing precursor and the reducing gas.

52. The method of claim 42 wherein the reducing gas comprises a plasma.

53. A method of forming a transistor for use in an active matrix liquid crystal display (AMLCD), comprising the steps of:
providing a substrate; and
depositing one or more silicon layers on the substrate using a cyclical deposition process, wherein the cyclical deposition process includes a plurality of cycles, wherein each cycle comprises establishing a flow of an inert gas in a process chamber and modulating the flow of the inert gas with alternating periods of exposure to a silicon-containing precursor and a reducing gas, wherein there is a period of flow of the inert gas between a period of exposure to the silicon-containing gas and a period of exposure to the reducing gas and a period of flow of the inert gas between a period of exposure to the reducing gas and the period of exposure to the silicon-containing gas, wherein the period of exposure to the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor each have the same duration, and wherein the period of exposure to the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor each have the same duration during each deposition cycle of the cyclical deposition process.

54. The method of claim 53 wherein one or more dopant compounds are adsorbed on the substrate along with one of either the silicon-containing precursor and the reducing gas.

55. The method of claim 53 wherein the reducing gas comprises a plasma.

56. A method of forming a transistor for use in an active matrix liquid crystal display (AMLCD), comprising the steps of:
providing a substrate; and
depositing one or more silicon layers on the substrate using a cyclical deposition process, wherein the cyclical deposition process includes a plurality of cycles, wherein each cycle comprises establishing a flow of an inert gas in a process chamber and modulating the flow of the inert gas with alternating periods of exposure to a silicon-containing precursor and a reducing gas, wherein there is a period of flow of the inert gas between a period of exposure to the silicon-containing gas and a period of exposure to the reducing gas and a period of flow of the inert gas between a period of exposure to the reducing gas and the period of exposure to the silicon-containing gas, wherein the period of exposure to the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor each have the same duration, and wherein at least one of the period of exposure to the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor has a different duration during one or more deposition cycles of the cyclical deposition process.

57. The method of claim 56 wherein one or more dopant compounds are adsorbed on the substrate along with one of either the silicon-containing precursor and the reducing gas.

58. The method of claim 56 wherein the reducing gas comprises a plasma.

59. A method of forming a transistor for use in an active matrix liquid crystal display (AMLCD), comprising the steps of:
    providing a substrate; and
    depositing one or more silicon layers on the substrate using a cyclical deposition process, wherein the cyclical deposition process includes a plurality of cycles, wherein each cycle comprises establishing a flow of an inert gas in a process chamber and modulating the flow of the inert gas with alternating periods of exposure to a silicon-containing precursor and a reducing gas, wherein there is a period of flow of the inert gas between a period of exposure to the silicon-containing gas and a period of exposure to the reducing gas and a period of flow of the inert gas between a period of exposure to the reducing gas and the period of exposure to the silicon-containing gas, wherein at least one of the period of exposure to the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor has a different duration, and wherein the period of exposure to the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor each have the same duration during each deposition cycle of the cyclical deposition process.

60. The method of claim 59 wherein one or more dopant compounds are adsorbed on the substrate along with one of either the silicon-containing precursor and the reducing gas.

61. The method of claim 59 wherein the reducing gas comprises a plasma.

62. A method of forming a transistor for use in an active matrix liquid crystal display (AMLCD), comprising the steps of:
    providing a substrate; and
    depositing one or more silicon layers on the substrate using a cyclical deposition process, wherein the cyclical deposition process includes a plurality of cycles, wherein each cycle comprises establishing a flow of an inert gas in a process chamber and modulating the flow of the inert gas with alternating periods of exposure to a silicon-containing precursor and a reducing gas, wherein there is a period of flow of the inert gas between a period of exposure to the silicon-containing gas and a period of exposure to the reducing gas and a period of flow of the inert gas between a period of exposure to the reducing gas and the period of exposure to the silicon-containing gas, wherein at least one of the period of exposure to the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor has a different duration, and wherein at least one of the period of exposure to the silicon-containing precursor, the period of exposure to the reducing gas, the period of flow of the inert gas between the period of exposure to the silicon-containing precursor and the period of exposure to the reducing gas, and the period of flow of the inert gas between the period of exposure to the reducing gas and the period of exposure to the silicon-containing precursor has a different duration during one or more deposition cycles of the cyclical deposition process.

63. The method of claim 62 wherein one or more dopant compounds are adsorbed on the substrate along with one of either the silicon-containing precursor and the reducing gas.

64. The method of claim 62 wherein the reducing gas comprises a plasma.

65. A method of forming a transistor for use in an active matrix liquid crystal display (AMLCD), comprising:
    positioning a substrate in a processing chamber;
    establishing a flow of an inert gas in the processing chamber;
    introducing a pulse of a silicon-containing precursor gas into the processing chamber;
    introducing a pulse of a doping gas into the processing chamber, wherein the pulse of the silicon-containing precursor gas and the pulse of the dopant gas overlap;
    generating a plasma of the silicon-containing precursor gas and the dopant gas by applying a high frequency HF power in the processing chamber;
    introducing a pulse of a purge gas into the processing chamber;
    introducing a pulse of a reducing gas into the processing chamber to form a silicon-containing layer; and
    introducing a pulse of a second purge gas into the processing chamber.

66. The method of claim 65, wherein the reducing gas is selected from the group consisting of hydrogen, borane, diborane, and derivatives thereof.

67. The method of claim 65, wherein the silicon-containing precursor gas comprises a compound selected from the group consisting of silane, disilane, silicon tetrachloride, dichlorosilane, and trichlorosilane.

68. The method of claim 65, wherein the high frequency RF power is between about 0.2 W/mm$^2$ and about 2 W/mm$^2$.

69. The method of claim 65, wherein the high frequency RF power is about 13.56 MHz.

70. The method of claim 65, wherein the silicon-containing layer is an amorphous silicon layer.

71. The method of claim 65, wherein the doping gas is selected from the group consisting of arsine, phosphine, and boron trihydride.

72. The method of claim 65, wherein the substrate is an optically transparent material with dimensions greater than about 500 mm×500 mm.

* * * * *

UNITED STATES PATENT AND TRADEMARK OFFICE
CERTIFICATE OF CORRECTION

| | | |
|---|---|---|
| PATENT NO. | : 7,439,191 B2 | |
| APPLICATION NO. | : 10/117692 | |
| DATED | : October 21, 2008 | |
| INVENTOR(S) | : Law et al. | |

It is certified that error appears in the above-identified patent and that said Letters Patent is hereby corrected as shown below:

Title Page;

In the Inventors (75):

Please delete "Quanyuan" and insert --Quan Yuan-- therefor;

In the References Cited (56):

Please insert --6,335,280 B1 1/2002 van der Jeugd--;

Please insert --2003/0049942 A1 3/2003 Haukka et al.--;

Please insert --2003/0072884 A1 4/2003 Zhang et al.--;

Please delete "2003/0089942 A1 5/2003 Haukka et al." and insert --2003/0089942 A1 5/2003 Bhattacharyya-- therefor;

Please insert --2003/0106490 A1 6/2003 Jallepally et al.--;

Please insert --2003/0108674 A1 6/2003 Chung et al.--;

Please insert --2003/0124262 A1 7/2003 Chen et al.--;

Please insert --2003/0143841 A1 7/2003 Yang et al.--;

Please insert --2003/0189561 A1 10/2003 Marchand et al.--;

Please insert --2003/0189208 A1 10/2003 Law et al.--;

Please insert --2003/0189232 A1 10/2003 Law et al.--;

Please insert --2003/0190423 A1 10/2003 Yang et al.--;

UNITED STATES PATENT AND TRADEMARK OFFICE
CERTIFICATE OF CORRECTION

PATENT NO. : 7,439,191 B2
APPLICATION NO. : 10/117692
DATED : October 21, 2008
INVENTOR(S) : Law et al.

It is certified that error appears in the above-identified patent and that said Letters Patent is hereby corrected as shown below:

Please insert --2003/0190497 A1 10/2003 Yang et al.--;

Please insert --2003/0213560 A1 11/2003 Wang et al.--;

Please insert --2003/0215570 A1 11/2003 Seutter et al.--;

Please insert --2003/0235961 A1 12/2003 Metzner et al.--;

In the Claims:

Column 12, Claim 2, Line 43, please insert --)-- after (SiCl$_4$;

Column 18, Claim 65, Line 37, please delete "HF" and insert --RF-- therefor;

Column 18, Claim 72, Line 63, please delete "500 mmx500 mm" and insert --500 mm x 500 mm--.

Signed and Sealed this

Twenty-eighth Day of April, 2009

JOHN DOLL
*Acting Director of the United States Patent and Trademark Office*